(12) United States Patent
Sunwoo et al.

(10) Patent No.: US 11,903,149 B2
(45) Date of Patent: Feb. 13, 2024

(54) ELECTRONIC DEVICE INCLUDING CONDUCTIVE MEMBER

(71) Applicant: Samsung Electronics Co., Ltd., Suwon-si (KR)

(72) Inventors: Seunghui Sunwoo, Suwon-si (KR); Suyoun Kim, Suwon-si (KR); Youngmin Bae, Suwon-si (KR); Daekyu Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 381 days.

(21) Appl. No.: 17/423,019

(22) PCT Filed: Jul. 7, 2021

(86) PCT No.: PCT/KR2021/008648
§ 371 (c)(1),
(2) Date: Jul. 14, 2021

(87) PCT Pub. No.: WO2022/025471
PCT Pub. Date: Feb. 3, 2022

(65) Prior Publication Data
US 2022/0346241 A1 Oct. 27, 2022

(30) Foreign Application Priority Data

Jul. 31, 2020 (KR) .................. 10-2020-0095771
Mar. 18, 2021 (KR) .................. 10-2021-0035415

(51) Int. Cl.
*H05K 5/00* (2006.01)
*H04M 1/02* (2006.01)
*H05K 5/03* (2006.01)

(52) U.S. Cl.
CPC ........ *H05K 5/0018* (2022.08); *H04M 1/0266* (2013.01); *H04M 1/0268* (2013.01); *H05K 5/03* (2013.01)

(58) Field of Classification Search
CPC ..... H05K 5/0018; H05K 5/03; H04M 1/0266; H04M 1/0268
(Continued)

(56) References Cited

U.S. PATENT DOCUMENTS 6,411,353 B1 * 6/2002 Yarita ................. G02F 1/13452
349/59
2008/0024714 A1 * 1/2008 Park ..................... H01L 23/552
349/150
(Continued)

FOREIGN PATENT DOCUMENTS

CN 1937878 A 3/2007
CN 102598888 A 7/2012
(Continued)

OTHER PUBLICATIONS

Chinese Office Action dated Sep. 20, 2022, issued in Chinese Application No. 202110881216.3.
(Continued)

*Primary Examiner* — April G Gonzales
(74) *Attorney, Agent, or Firm* — Jefferson IP Law, LLP

(57) ABSTRACT

An electronic device is provided. The electronic device includes a foldable display, a decoration member made of a resin material to surround at least a portion of the foldable display, a support member configured to support the foldable display and including a metal area connected to the decoration member, and a conductive member disposed on the decoration member and electrically connected to the metal area. The conductive member may include a first conductive member arranged to face the support member and a second
(Continued)

conductive member arranged parallel to the first conductive member and electrically connected to the first conductive member.

22 Claims, 13 Drawing Sheets

(58) Field of Classification Search
USPC .......................................................... 455/566
See application file for complete search history.

(56) References Cited

U.S. PATENT DOCUMENTS

| | | | | |
|---|---|---|---|---|
| 2011/0110063 | A1* | 5/2011 | Sauers | H05K 5/0017 361/796 |
| 2013/0083275 | A1* | 4/2013 | Ai | G02F 1/133308 349/106 |
| 2013/0125958 | A1* | 5/2013 | Meakin | H01L 31/048 438/57 |
| 2015/0062525 | A1* | 3/2015 | Hirakata | G02F 1/133305 349/158 |
| 2017/0142241 | A1* | 5/2017 | Kim | H04M 1/026 |
| 2019/0251890 | A1* | 8/2019 | Guo | G06F 3/0412 |
| 2020/0051468 | A1* | 2/2020 | Jung | H01Q 21/30 |
| 2020/0119429 | A1* | 4/2020 | Park | H01Q 5/335 |
| 2020/0136231 | A1* | 4/2020 | Lee | H04M 1/0216 |
| 2020/0221587 | A1* | 7/2020 | An | H05K 5/0017 |
| 2020/0245481 | A1* | 7/2020 | Yoon | H01Q 1/44 |
| 2020/0264658 | A1* | 8/2020 | Seo | G06F 1/1616 |
| 2020/0266524 | A1* | 8/2020 | Yoon | H01Q 1/48 |
| 2020/0267838 | A1* | 8/2020 | An | H04M 1/0216 |
| 2020/0267839 | A1* | 8/2020 | Woo | H05K 5/0226 |
| 2020/0267861 | A1* | 8/2020 | Kim | G06F 1/1681 |
| 2020/0350939 | A1* | 11/2020 | Lee | H05K 1/0277 |
| 2021/0029841 | A1* | 1/2021 | Kim | G06F 1/1616 |

FOREIGN PATENT DOCUMENTS

| | | |
|---|---|---|
| CN | 204966695 U | 1/2016 |
| CN | 108738288 A | 11/2018 |
| CN | 110032013 A | 7/2019 |
| CN | 110050252 A | 7/2019 |
| CN | 110718156 A | 1/2020 |
| CN | 110830618 A | 2/2020 |
| CN | 210671188 U | 6/2020 |
| CN | 211062850 U | 7/2020 |
| EP | 3 608 751 A1 | 2/2020 |
| KR | 10-2007-0016329 A | 2/2007 |
| KR | 10-2008-0011802 A | 2/2008 |
| KR | 10-2011-0064274 A | 6/2011 |
| KR | 10-2017-0056292 A | 5/2017 |
| KR | 10-2020-0018282 A | 2/2020 |
| KR | 10-2020-0086505 A | 7/2020 |
| KR | 10-2021-0152910 A | 12/2021 |
| TW | 201327877 A | 7/2013 |
| WO | 2003/075079 A1 | 9/2003 |
| WO | 2020/145525 A1 | 7/2020 |

OTHER PUBLICATIONS

Chinese Office Action dated Feb. 21, 2022, issued in Chinese Application No. 202110882559.1.
Chinese Office Action dated Mar. 30, 2022, issued in Chinese Application No. 202110881216.3.
International Search Report dated Oct. 13, 2021, issued in International Application No. PCT/KR2021/008648.
European Search Report dated Dec. 21, 2021, issued in European Application No. 21185597.8.
Chinese Office Action dated Dec. 23, 2021, issued in Chinese Application No. 202110881216.3.
Korean Decision on Grant dated Jun. 27, 2023, issued in Korean Patent Application No. 10-2023-0073061.
Extended European Search Report dated Jun. 5, 2023, issued in European Patent Application No. 22204875.3.
Indian Office Action dated Jul. 31, 2023, issued in Indian Patent Application No. 202217003325.

* cited by examiner

ELECTRONIC DEVICE INCLUDING CONDUCTIVE MEMBER

CROSS-REFERENCE TO RELATED APPLICATION(S)

This application is a U.S. National Stage application under 35 U.S.C. § 371 of an International application number PCT/KR2021/008648, filed on Jul. 7, 2021, which is based on and claims priority of a Korean patent application number 10-2020-0095771, filed on Jul. 31, 2020, in the Korean Intellectual Property Office, and of a Korean patent application number 10-2021-0035415, filed on Mar. 18, 2021, in the Korean Intellectual Property Office, the disclosure of each of which is incorporated by reference herein in its entirety.

TECHNICAL FIELD

The disclosure relates to an electronic device including a conductive member. More particularly, the disclosure relates to an electronic device (e.g., a portable terminal) including a conductive member disposed on a decoration member and electrically connected to a metal area, where the conductive member includes a first conductive member arranged to face a support member and a second conductive member arranged parallel to the first conductive member and electrically connected to the first conductive member.

BACKGROUND ART

Due to the development of information communication technology and semiconductor technology, the distribution and use of various electronic devices are rapidly increasing. In particular, recent electronic devices are being developed such that users are capable of communicating with each other while carrying the electronic devices. Electronic devices may output information stored therein as sound or an image. As the degree of integration of electronic devices has increased and super-high-speed and large-capacity wireless communication has become popular, multiple functions have recently come to be provided in a single electronic device, such as a mobile communication terminal. For example, various functions, such as an entertainment function (e.g., a game function), a multimedia function (e.g., a music/video reproduction function), a communication and security function for mobile banking or the like, a schedule management function, and an e-wallet function, are integrated in a single electronic device, in addition to a communication function. Such an electronic device has been miniaturized so that the user can conveniently carry the electronic device.

As the mobile communication service is extended to the multimedia service area, it is necessary to increase the sizes of the displays of electronic devices so as to allow the users to fully utilize the multimedia service as well as a voice call or short message service. However, the size of the display of an electronic device is in a trade-off relationship with the miniaturization of the electronic device.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide an electronic device (e.g., a portable terminal) including a display having a flat surface or a flat surface and a curved surface. An electronic device including an existing type of display may require another terminal when implementing a screen larger than the size of the electronic device due to the structure of a fixed display. Accordingly, electronic devices including a foldable or rollable display have been and are being researched.

In a foldable electronic device, in order to implement the folding of a display, a physical separation space between display components is required. However, electrical surge may be introduced into a display panel from the outside of the electronic device through the separation space. It may be possible to reduce the electrical surge introduced into the display panel using a decoration member surrounding the display panel. However, when the area of the decoration member increases, the volume of the electronic device may increase, or the size of the actual display area of the display may decrease.

Technical Solution

According to various embodiments of the disclosure, it is possible to provide a display that is capable of being unfoldable or folded through a user's manipulation.

According to various embodiments of the disclosure, an electronic device including a discharge path capable of transmitting electrical surge introduced from the outside to a ground may be provided.

However, issues to be addressed in this disclosure are not limited to those described above, and may be variously expanded without departing from the spirit and scope of this disclosure.

Additional aspects will be set forth in part in the description which follows and, in part, will be apparent from the description, or may be learned by practice of the presented embodiments.

In accordance with an aspect of the disclosure, an electronic device is provided. The electronic device includes a foldable display, a decoration member made of a resin material to surround at least a portion of the foldable display, a support member configured to support the foldable display and including a metal area connected to the decoration member, and a conductive member disposed on the decoration member and electrically connected to the metal area. The conductive member may include a first conductive member arranged to face the support member and a second conductive member arranged parallel to the first conductive member and electrically connected to the first conductive member.

In accordance with another aspect of the disclosure, an electronic device is provided. The electronic device includes a foldable display, a decoration member made of a resin material and surrounding at least a portion of the foldable display, a support member configured to support the foldable display and including a metal area connected to the decoration member and a resin area disposed in a segment portion of the metal area, and a conductive member electrically connected to the metal area. The decoration member may include a first decoration member area facing the support member, and a second decoration member area extending from the first decoration member area and facing a direction different from a direction the first decoration member area faces, the conductive member may be disposed in the first decoration member area and the second decoration member area, and the conductive member may include a third conductive member and a fourth conductive member spaced apart from each other with reference to the segment portion.

Advantageous Effects

According to various embodiments of the disclosure, an electronic device is capable of including a discharge path capable of discharging electrical surge introduced into the electronic device using a support member electrically connected to a conductive member.

According to various embodiments of the disclosure, an electronic device includes a decoration member having a reduced area overlapping the display. Therefore, it is possible to increase a substantial screen display area, and to improve aesthetics.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR DISCLOSURE

Figure 1:
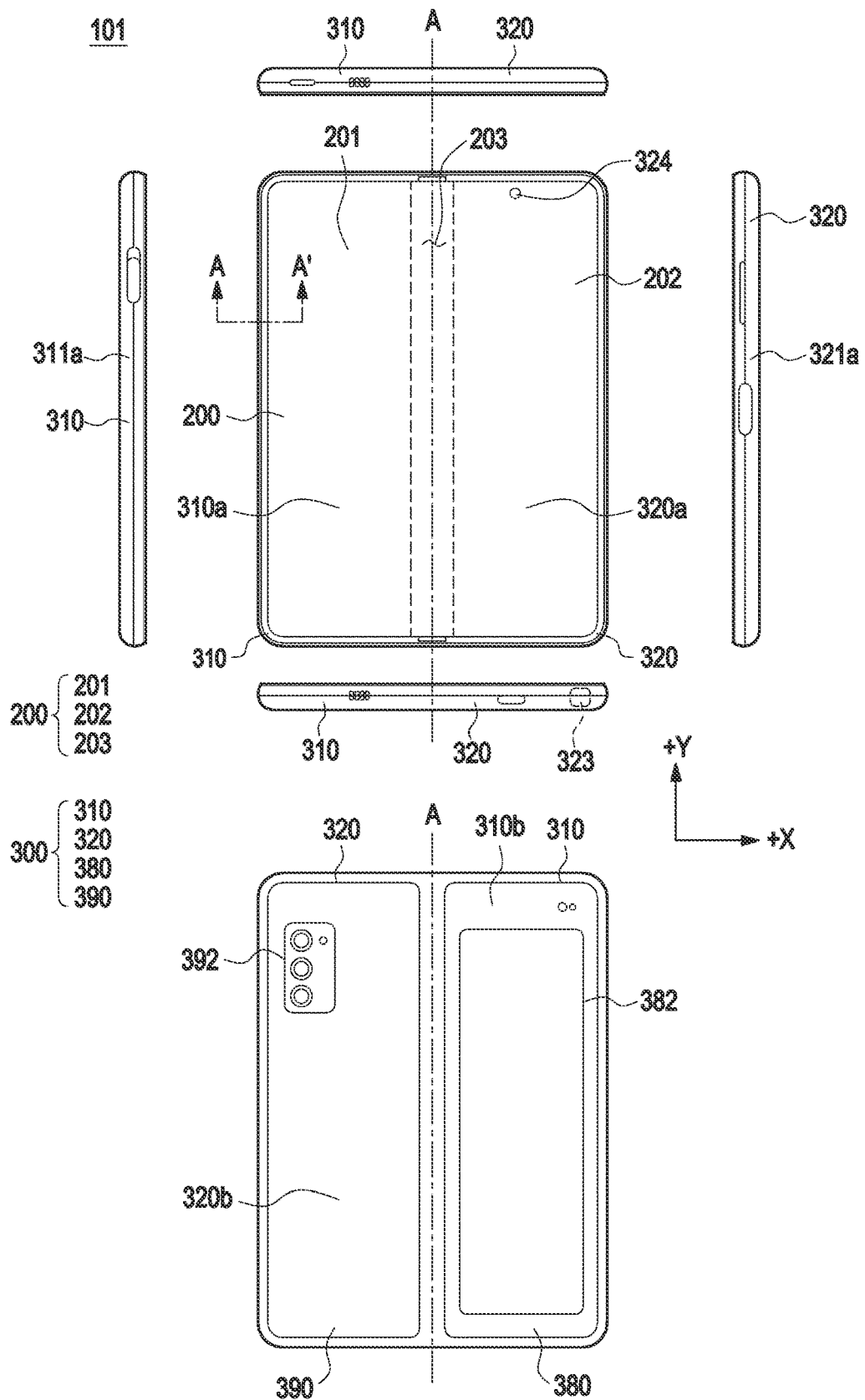
FIG. 1 is a view illustrating a state in which an electronic device is unfolded according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
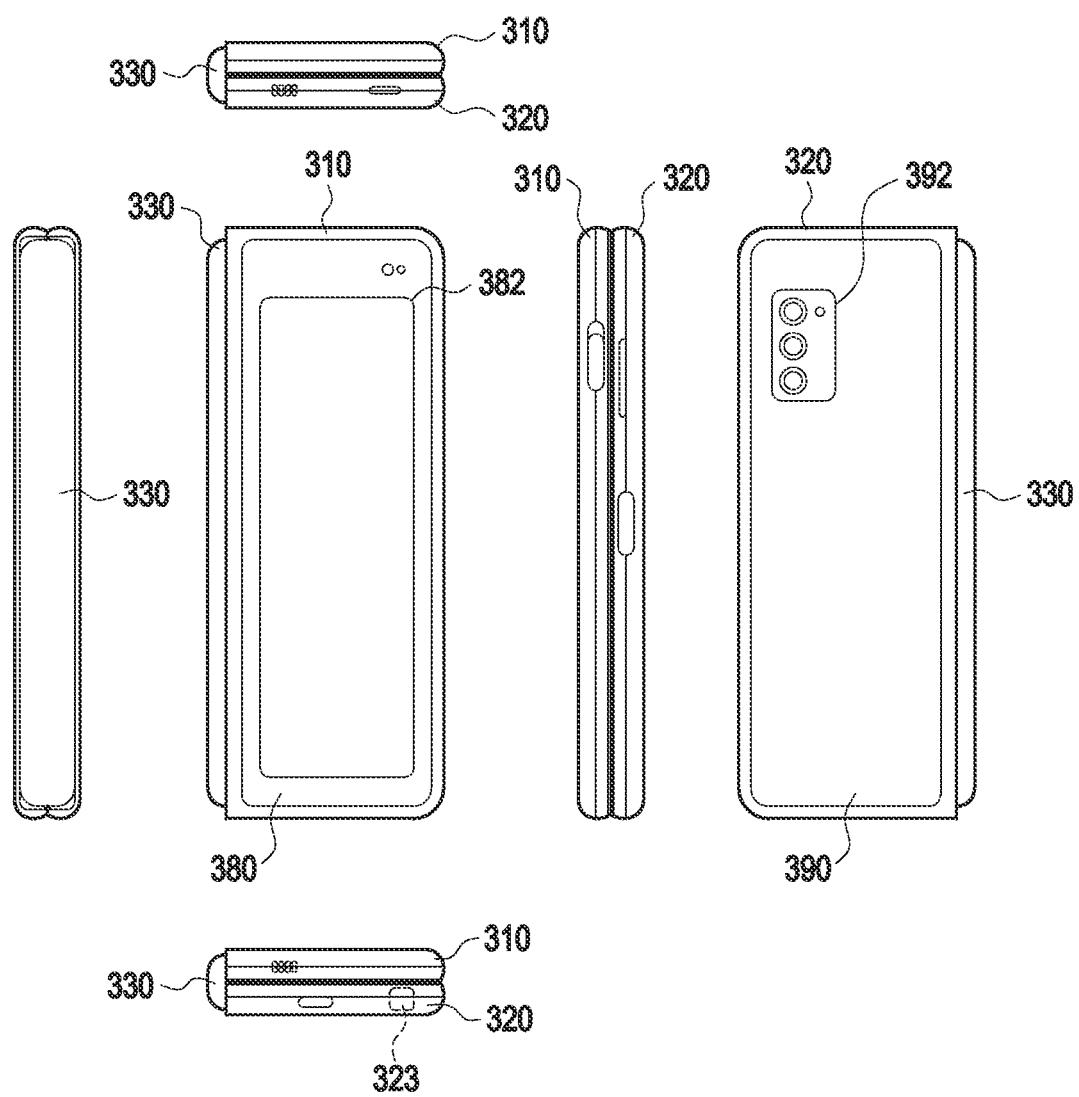
FIG. 2 is a view illustrating a state in which an electronic device is folded according to an embodiment of the disclosure.

FIG. 1 is a view illustrating a state in which an electronic device is unfolded according to an embodiment of the disclosure. FIG. 2 is a view illustrating a state in which an electronic device is folded according to an embodiment of the disclosure.

Referring to FIGS. 1 and 2, in an embodiment of the disclosure, an electronic device 101 may include a foldable housing 300, a hinge cover 330 configured to cover the foldable portion of the foldable housing 300, and a flexible or foldable display 200 (hereinafter, simply referred to as a "display" 200) disposed in a space defined by the foldable housing 300. According to an embodiment of the disclosure, the surface on which the display 200 is disposed is defined as the front surface (e.g., a first surface 310a and a third surface 320a) of the electronic device 101. In addition, a surface opposite to the front surface is defined as a rear surface (e.g., a second surface 310b and a fourth surface 320b) of the electronic device 101. In addition, a surface surrounding the space between the front and rear surfaces is defined as a side surface (e.g., the first side surface 311a and the second side surface 321a) of the electronic device 101.

Figure 3:
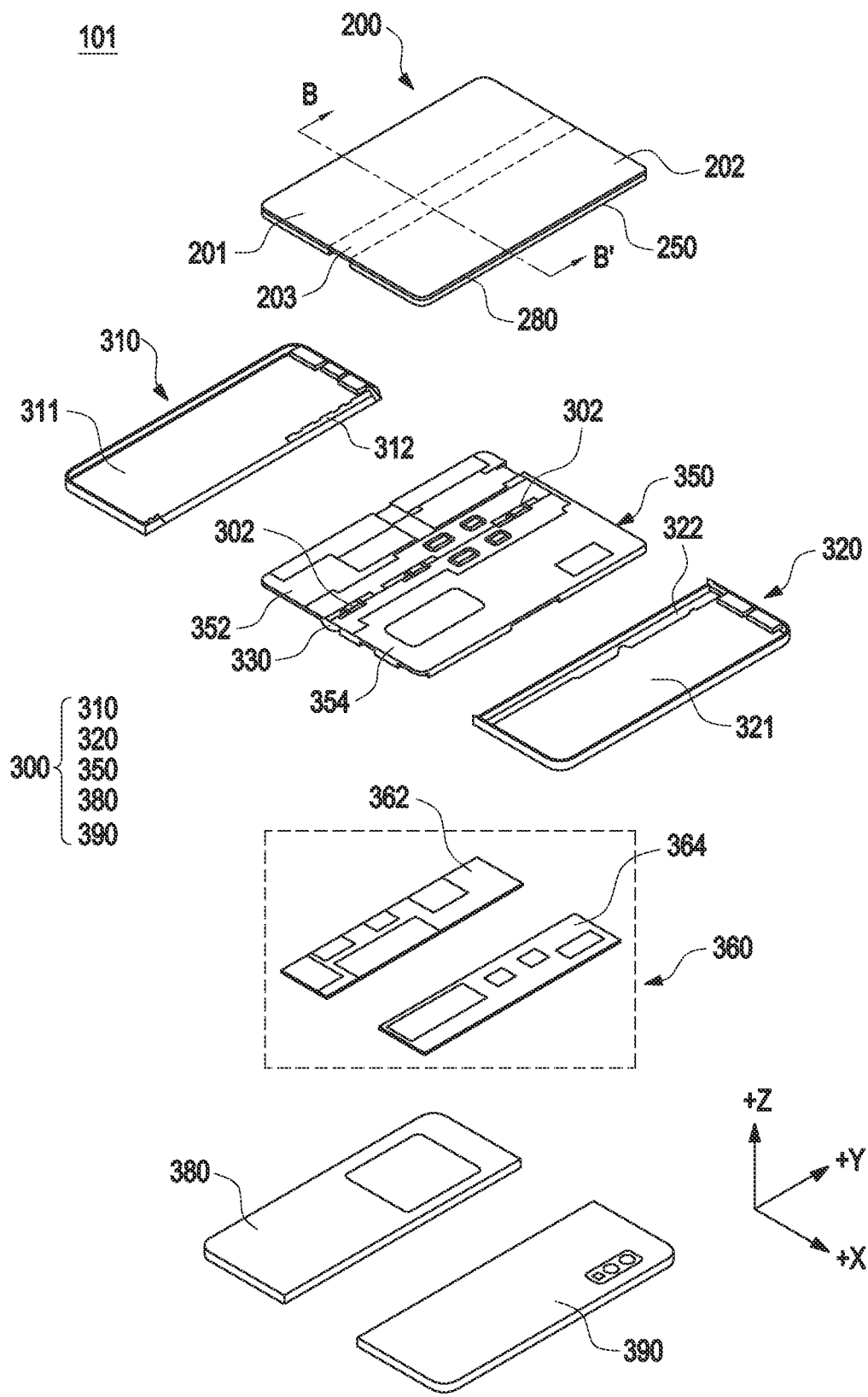
FIG. 3 is an exploded perspective view illustrating an electronic device according to an embodiment of the disclosure.

According to various embodiments of the disclosure, the foldable housing 300 may include a first housing 310, a second housing 320 including a sensor area 324, a first rear cover 380, a second rear cover 390, and a hinge structure (e.g., the hinge structure 302 in FIG. 3). The foldable housing 300 of the electronic device 101 is not limited to the shape and assembly illustrated in FIGS. 1 and 2, but may be implemented by a combination and/or an assembly of different shapes or components. For example, in another embodiment of the disclosure, the first housing 310 and the first rear cover 380 may be integrally configured, and the second housing 320 and the second rear cover 390 may be integrally configured. According to various embodiments of the disclosure, the first housing 310 may be connected to the hinge structure 302, and may include the first surface 310a facing a first direction and the second surface 310b facing a second direction opposite to the first direction. The second housing 320 may be connected to the hinge structure 302, and may include the third surface 320a facing a third direction and the fourth surface 320b facing a fourth direction opposite to the third direction. The second housing 320 is rotatable about the hinge structure 302 relative to the first housing 310. Accordingly, the electronic device 101 may be deformable into the folded state or the unfolded state. In the folded state of the electronic device 101, the first surface 310a may face the third surface 320a, and in the unfolded state, the third direction may be the same as the first direction. According to an embodiment of the disclosure, in the state in which the electronic device 101 is unfolded, the first and third directions may be the +Z direction, and the second and fourth directions may be the −Z direction. According to an embodiment of the disclosure, in the state in which the electronic device 101 is folded, the first and second directions may be the +Z direction, and the second and third directions may be the −Z direction. In the following, unless otherwise stated, a direction will be described based on the unfolded state of the electronic device 101.

According to various embodiments of the disclosure, the first housing 310 and the second housing 320 may be disposed on opposite sides about the folding axis A, and may have generally symmetrical shapes with respect to the folding axis A. As will be described later, the angle or distance between the first housing 310 and the second housing 320 may vary depending on whether the electronic device 101 is in the unfolded state, in the folded state, or in the intermediate state. According to an embodiment of the disclosure, unlike the first housing 310, the second housing 320 may further include the sensor area 324 in which various sensors are disposed. However, the first housing 310 and the second housing 320 may have mutually symmetrical shapes in other areas. According to an embodiment of the disclosure, the folding axis A may be a plurality of (e.g., two) parallel folding axes.

According to an embodiment of the disclosure, the electronic device 101 may include a structure into which a digital pen is insertable. For example, a hole 323 into which the digital pen is insertable may be provided in the side surface of the first housing 310 or the side surface of the second housing 320 of the electronic device 101.

According to various embodiments of the disclosure, the first housing 310 and the second housing 320 may define a recess that accommodates the display 200 together. According to an embodiment of the disclosure, due to the sensor area 324, the recess may have two or more different widths in a direction perpendicular to the folding axis A.

According to various embodiments of the disclosure, at least a portion of the first housing 310 and at least a portion of the second housing 320 may be made of a metal material or a non-metal material having the rigidity of a level selected to support the display 200. The at least a portion made of the metal material may provide a ground plane of the electronic device 101, and may be electrically connected to a ground line defined on a printed circuit board (e.g., the printed circuit board 360 in FIG. 3).

According to various embodiments of the disclosure, the sensor area 324 may be defined to have a predetermined area adjacent to one corner of the second housing 320. However, the arrangement, shape, and size of the sensor area 324 are not limited to those in the illustrated example. For example, in another embodiment of the disclosure, the sensor area 324 may be provided in any area between another corner or an upper end corner or a lower end corner of the second housing 320 or in the first housing 310. In an embodiment of the disclosure, components embedded in the electronic device 101 to perform various functions may be exposed to the front surface of the electronic device 101 through the sensor area 324 or one or more openings provided in the sensor area 324. In various embodiments of the disclosure, the components may include various types of sensors. The sensors may include at least one of, for example, a front camera, a receiver, or a proximity sensor.

According to various embodiments of the disclosure, the first rear cover 380 may be disposed at one side of the folding axis A on the rear surface of the electronic device 101, and may have, for example, a substantially rectangular periphery, which may be surrounded by the first housing 310. Similarly, the second rear cover 390 may be disposed at the other side of the folding axis A on the rear surface of the electronic device 101, and the periphery of the second rear cover 390 may be surrounded by the second housing 320.

According to various embodiments of the disclosure, the first rear cover 380 and the second rear cover 390 may have substantially symmetrical shapes about the folding axis (the axis A). However, the first rear cover 380 and the second rear cover 390 do not necessarily have mutually symmetrical shapes, and in another embodiment of the disclosure, the electronic device 101 may include the first rear cover 380 and the second rear cover 390, which have various shapes.

According to various embodiments of the disclosure, the first rear cover 380, the second rear cover 390, the first housing 310, and the second housing 320 may define a space in which various components (e.g., a printed circuit board or a battery) of the electronic device 101 can be arranged. According to an embodiment of the disclosure, one or more components may be disposed or visually exposed on the rear surface of the electronic device 101. For example, at least a portion of a sub-display (not illustrated) may be visually exposed through a first rear area 382 of the first rear cover 380. In another embodiment of the disclosure, one or more components or sensors may be visually exposed through a second rear area 392 of the second rear cover 390. In various embodiments of the disclosure, the sensors may include a proximity sensor and/or a rear camera.

According to various embodiments of the disclosure, a front camera, which is exposed to the front surface of the electronic device 101 through the one or more openings provided in the sensor area 324 or a rear camera exposed through the second rear area 392 of the second rear cover 390, may include one or more lenses, an image sensor, and/or an image signal processor. The flash 313 may include, for example, a light-emitting diode or a xenon lamp. In some embodiments of the disclosure, two or more lenses (e.g., an infrared camera, a wide-angle lens, and a telephoto lens), and image sensors may be disposed on one surface of the electronic device 101.

Referring to FIG. 2, the hinge cover 330 may be disposed between the first housing 310 and the second housing 320 so as to cover internal components (e.g., the hinge structure 302 in FIG. 3). According to an embodiment of the disclosure, the hinge cover 330 may be covered by a portion of the first housing 310 and a portion of the second housing 320, or may be exposed to the outside depending on the state of the electronic device 101 (the unfolded state (flat state) or the folded state).

According to an embodiment of the disclosure, as illustrated in FIG. 1, when the electronic device 101 is in the unfolded state, the hinge cover 330 may not be exposed by being covered by the first housing 310 and the second housing 320. As another example, as illustrated in FIG. 2, when the electronic device 101 is in the folded state (e.g., the fully folded state), the hinge cover 330 may be exposed to the outside between the first housing 310 and the second housing 320. As still another example, when the first housing 310 and the second housing 320 are in the intermediate state in which the first housing 310 and the second housing 320 are folded to form a predetermined angle therebetween, a portion of the hinge cover 330 may be exposed to the outside between the first housing 310 and the second housing 320. In this case, however, the exposed area may be smaller than that in the fully folded state. In an embodiment of the disclosure, the hinge cover 330 may include a curved surface.

According to various embodiments of the disclosure, the display 200 may be disposed in a space defined by the foldable housing 300. For example, the display 200 may be seated in the recess defined by the foldable housing 300, and may constitute most of the front surface of the electronic device 101. Accordingly, the front surface of the electronic device 101 may include the display 200, and partial areas of the first housing 310 and the second housing 320, which are adjacent to the display 200. In addition, the rear surface of the electronic device 101 may include the first rear cover 380, a partial area of the first housing 310 adjacent to the first rear cover 380, the second rear cover 390, and a partial area of the second housing 320 adjacent to the second rear cover 390.

According to various embodiments of the disclosure, the display 200 may refer to a display in which at least a portion is deformable into a planar surface or a curved surface. According to an embodiment of the disclosure, the display 200 may include a folding area 203, a first area 201 disposed at one side of the folding area 203 (e.g., the left side of the folding area 203 illustrated in FIG. 2), and a second area 202 disposed at the other side of the folding area 203 (e.g., the right side of the folding area 203 illustrated in FIG. 2).

However, the area division of the display 200 is illustrative, and the display 200 may be divided into multiple areas (e.g., four or more areas or two areas) depending on the structure or functions thereof. For example, in the embodiment illustrated in FIG. 2, the area of the display 200 may be divided by the folding area 203 or the folding axis (the axis A) extending parallel to the y axis. However, in another embodiment of the disclosure, the area of the display 200 may be divided based on another folding area (e.g., a folding area parallel to the x axis) or another folding axis (e.g., a folding axis parallel to the x axis). According to an embodiment of the disclosure, the display 200 may be coupled to or disposed adjacent to a touch-sensitive circuit, a pressure sensor that is capable of measuring touch intensity (pressure), and/or a digitizer configured to detect a magnetic field-type stylus pen.

According to various embodiments of the disclosure, the first area 201 and the second area 202 may have generally symmetrical shapes about the folding area 203. However, unlike the first area 201, the second area 202 may include a notch cut due to the presence of the sensor area 324, but may be symmetric to the first area 201 in the area other than the sensor area 524. In other words, the first area 201 and the second area 202 may include portions having mutually symmetrical shapes and portions having mutually asymmetrical shapes.

Hereinafter, the operations of the first housing 310 and the second housing 320 according to the states of the electronic device 101 (e.g., a flat or unfolded state and a folded state) and respective areas of the display 200 will be described.

According to various embodiments of the disclosure, when the electronic device 101 is in the unfolded state (the flat state) (e.g., FIG. 2), the first housing 310 and the second housing 320 may be disposed to form an angle of 180 degrees therebetween and to face the same direction. The surface of the first area 201 and the surface of the second area 202 of the display 200 form 180 degrees relative to each other, and may face the same direction (e.g., the front direction of the electronic device). The folding area 203 may form the same plane as the first area 201 and the second area 202.

According to various embodiments of the disclosure, when the electronic device 101 is in the folded state (e.g., FIG. 3), the first housing 310 and the second housing 320 may be disposed to face each other. The surface of the first area 201 and the surface of the second area 202 of the display 200 may face each other while forming a narrow angle (e.g., an angle between 0 and 10 degrees) relative to each other. At least a portion of the folding area 203 may be configured as a curved surface having a predetermined curvature.

According to various embodiments of the disclosure, when the electronic device 101 is in the intermediate state (e.g., FIG. 3), the first housing 310 and the second housing 320 may be disposed to form a predetermined angle relative to each other. The surface of the first area 201 and the surface of the second area 202 of the display 200 may form an angle larger than that in the folded state and smaller than that in the unfolded state. At least a portion of the folding area 203 may be configured as a curved surface having a predetermined curvature, and the curvature in this case may be smaller than that in the folded state.

FIG. 3 is an exploded perspective view illustrating an electronic device according to an embodiment of the disclosure.

Referring to FIG. 3, the electronic device 101 may include a foldable housing 300, a display 200, a hinge structure 302, a bracket assembly 350, and a substrate unit 360. The foldable housing 300 may include a first housing 310, a second housing 320, a bracket assembly 350, a first rear cover 380, and a second rear cover 390. The configuration of the foldable housing 300 and the display 200 of FIG. 3 may be partially or wholly the same as the configuration of the foldable housing 300 and the display 200 of FIG. 1.

According to various embodiments of the disclosure, the bracket assembly 350 may include a first mid plate 352 and a second mid plate 354. A hinge structure 302 may be disposed between the first mid plate 352 and the second mid plate 354. When the hinge structure 302 is viewed from the outside, the hinge structure 302 may be covered by a hinge cover (e.g., the hinge cover 330 in FIG. 3). According to an embodiment of the disclosure, a printed circuit board (e.g., a flexible printed circuit board (FPCB)) may be disposed on the bracket assembly 350 across the first mid plate 352 and the second mid plate 354.

According to various embodiments of the disclosure, the board unit 360 may include a first circuit board 362 disposed on the first mid plate 352 and a second circuit board 364 disposed on the second mid plate 354. The first circuit board 362 and the second circuit board 364 may be disposed in a space defined by the bracket assembly 350, the first housing 310, the second housing 320, the first rear cover 380, and the second rear cover 390. Components for implementing various functions of the electronic device 101 may be mounted on the first circuit board 362 and the second circuit board 364.

According to various embodiments of the disclosure, the first housing 310 and the second housing 320 may be assembled so as to be coupled to the opposite sides of the bracket assembly 350 in the state in which the display 200 is coupled to the bracket assembly 350. According to an embodiment of the disclosure, the first housing 310 may include a first side member 311 surrounding at least a portion of the side surface of the first mid plate 352, and the second housing 320 may include a second side member 321 surrounding at least a portion of the side surface of the second mid plate 354. The first housing 310 may include a first rotational support surface 312, and the second housing 320 may include a second rotational support surface 322, which corresponds to the first rotational support surface 312. The first rotational support surface 312 and the second rotational support surface 322 may include curved surfaces corresponding to curved surfaces included in the hinge cover 330. According to an embodiment of the disclosure, the first side member 311 surrounds at least a portion between the first surface 310a and the second surface 310b, and may include a first side surface (e.g., the first side surface 311a in FIG. 1) perpendicular to the first direction or the second direction. According to an embodiment of the disclosure, the second side member 321 may surround at least a portion between the third surface 320a and the fourth surface 320b, and may include a second side surface (e.g., the second side surface 321a in FIG. 1) perpendicular to the third direction or the fourth direction.

According to an embodiment of the disclosure, when the electronic device 101 is in the unfolded state (e.g., the electronic device in FIG. 1), the first rotation support surface 312 and the second rotation support surface 322 may cover the hinge cover 330, and the hinge cover 330 may not be exposed to the rear surface of the electronic device 101 or may be exposed to a minimum. As still another embodiment of the disclosure, when the electronic device 101 is in the folded state (e.g., the electronic device in FIG. 2), the first rotational support surface 312 and the second rotational support surface 322 may rotate along the curved surface included in the hinger cover 330 so that the hinge cover 330 may be exposed to the rear surface of the electronic device 101 to a maximum.

Figure 4:
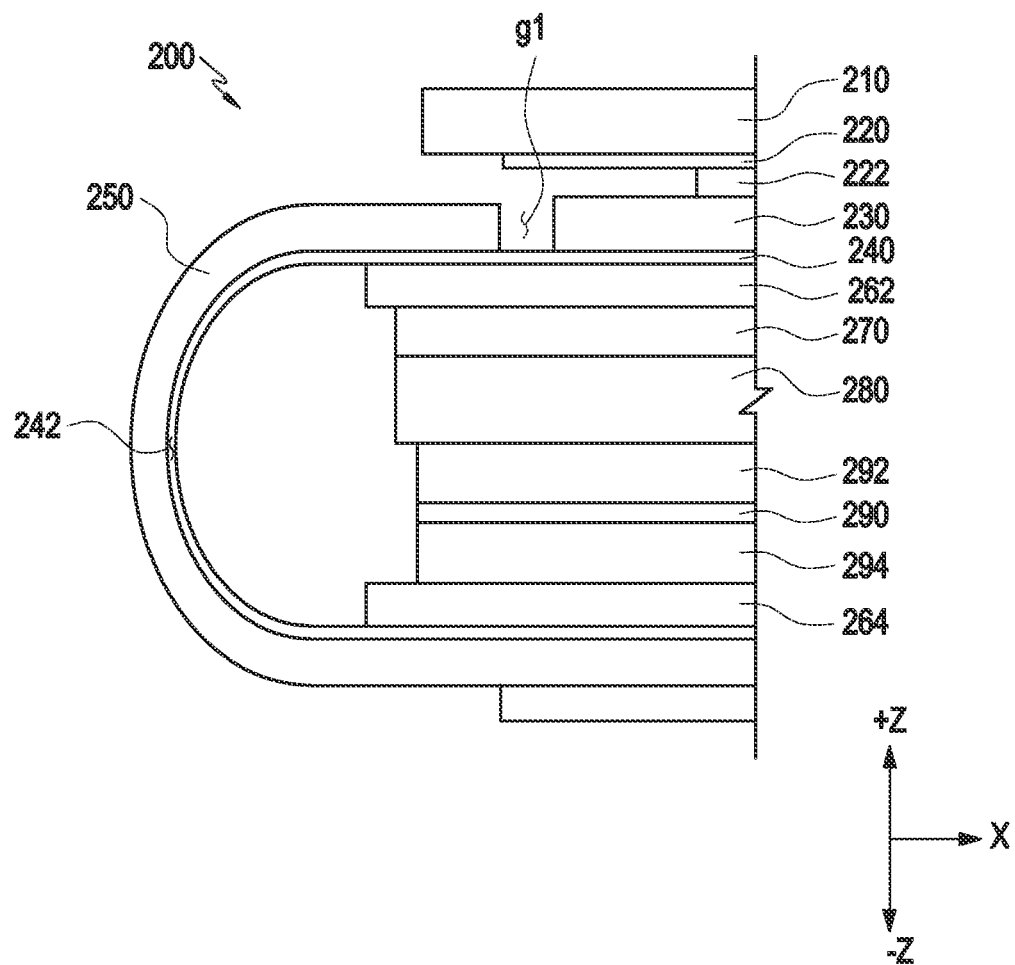
FIG. 4 is a cross-sectional view taken along line B-B' in FIG. 3 according to an embodiment of the disclosure.

FIG. 4 is a cross-sectional view taken along line B-B' in FIG. 3 according to an embodiment of the disclosure.

Referring to FIG. 4, the display 200 may include components for visually providing information to the outside (e.g., a user) of the electronic device 101. The configuration of the display 200 of FIG. 4 may be wholly or partially the same as the configuration of the display 200 of FIG. 1 or 3.

According to various embodiments of the disclosure, The display 200 may include at least one of a protection film 210 configured to protect the outer surface of the display 200, a window member 220 disposed below the protection film 210 (e.g., the −Z direction), a polarizing layer 230 disposed on the window member 220 via an adhesive 222, a display panel 240 disposed under the polarizing layer 230 and configured to display visual information, a bending protection layer (BPL) 250 configured to protect the display panel 240, a first protection film 262 disposed under the display panel 240, a cushion layer 270 disposed under the first protection film 262, a display support plate 280 disposed under the cushion layer 270, a column spacer 290 separating a substrate (e.g., a color filter substrate 292 and a TFT substrate 294), or a second protection film 264.

According to various embodiments of the disclosure, at least a portion of the window member 220 may be made of a material that is substantially transparent and flexible. For example, the window member 220 may be made of ultra thin glass (UTG) or polyimide film. The display panel 240 may be exposed to the outside of the electronic device 101 through the window member 220. According to an embodiment of the disclosure, the protective film 210 and/or the window member 220 may be interpreted as a transparent cover.

According to various embodiments of the disclosure, a portion of the display panel 240 may be curved, and the curved portion of the display panel 240 may be defined as a bent portion 242. According to an embodiment of the disclosure, the bent portion 242 may be electrically connected to an electronic component (e.g., a display driving circuit). According to an embodiment of the disclosure, the display panel 240 may extend through the bent portion 242, and may surround at least a portion of other components of the display 200 (e.g., the cushion layer 270 or the display support plate 280). According to an embodiment of the disclosure, display panel 240 may be connected to the display driving circuit in a chip on plastic (COP) manner According to an embodiment of the disclosure, at least of the display panel and/or the bending protection layer may be covered by a decoration member (e.g., decoration member of FIG. 5).

According to various embodiments of the disclosure, the bending protection layer 250 may reduce tensile stress applied to the display panel 240. According to an embodiment of the disclosure, the bending protection layer 250 may extend along the bent portion 242 of the display panel 240. The bending protection layer 250 may support the bent portion 242 so that the bent portion 242 is curved along a neutral plane.

According to various embodiments of the disclosure, the display 200 may include a first separation space g1. At least a portion of the first separation space g1 may be surrounded by the display panel 240, the bending protection layer 250, and the polarizing layer 230. For example, the bending protection layer 250 and the polarizing layer 230 may be disposed on the display panel 240 to be spaced apart from each other in the width direction of the electronic device 101 (e.g., the X-axis direction). Since the first separation space g1 is physically exposed to the outside of the electronic device (e.g., the electronic device 101 in FIG. 1), when there is no discharge structure, electrical surge (an electrical surge 800 in FIG. 5) (e. g., static electrical charge) may be introduced into the display panel 240 through the first separation space g1. A structure for reducing the electrical surge 800 introduced into the display panel 240 through the first separation space g1 will be described with reference to FIGS. 5 and 6 below.

Figure 5:
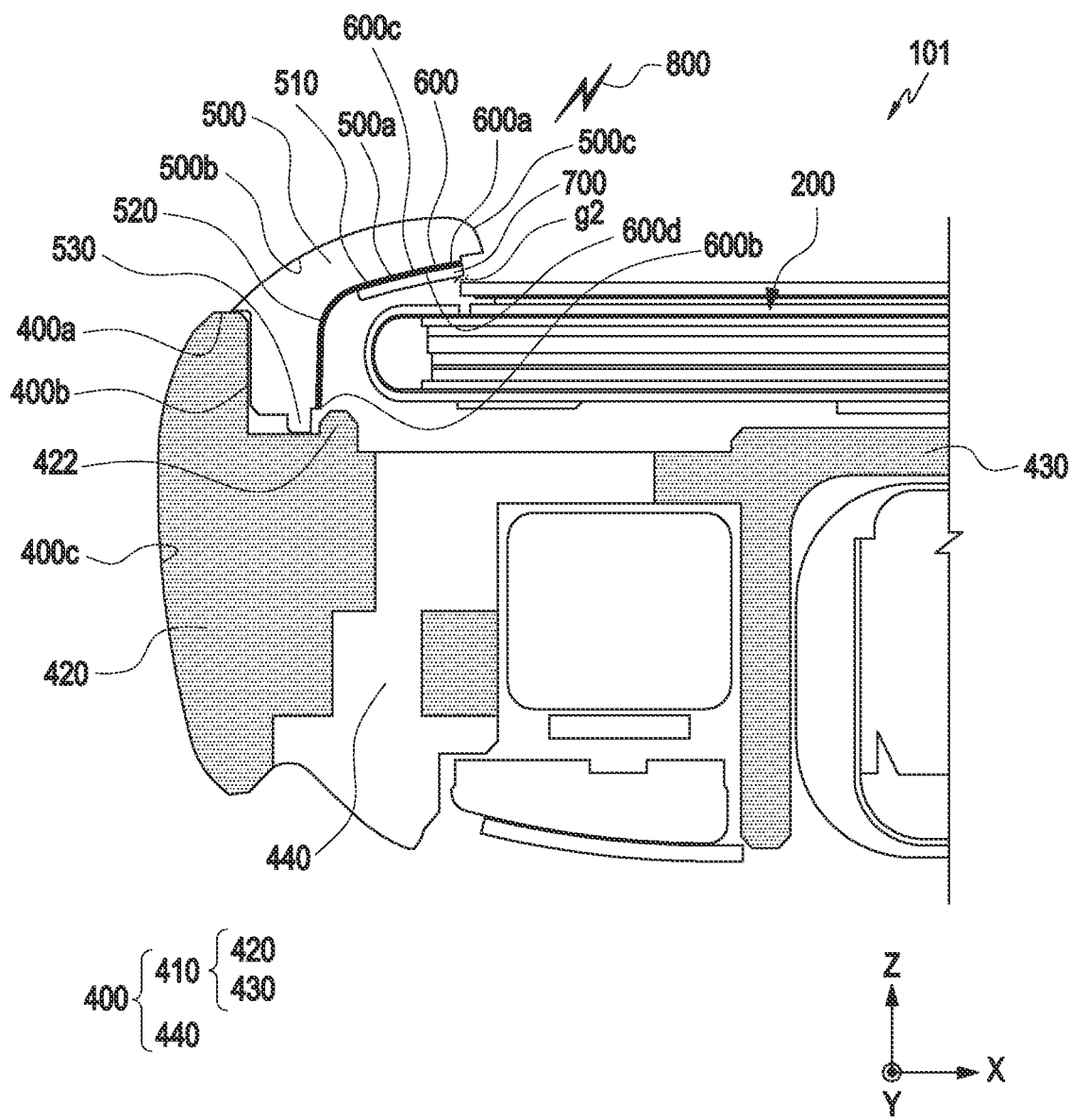
FIG. 5 is a cross-sectional view taken along line A-A' in FIG. 1 according to an embodiment of the disclosure.
Figure 6:
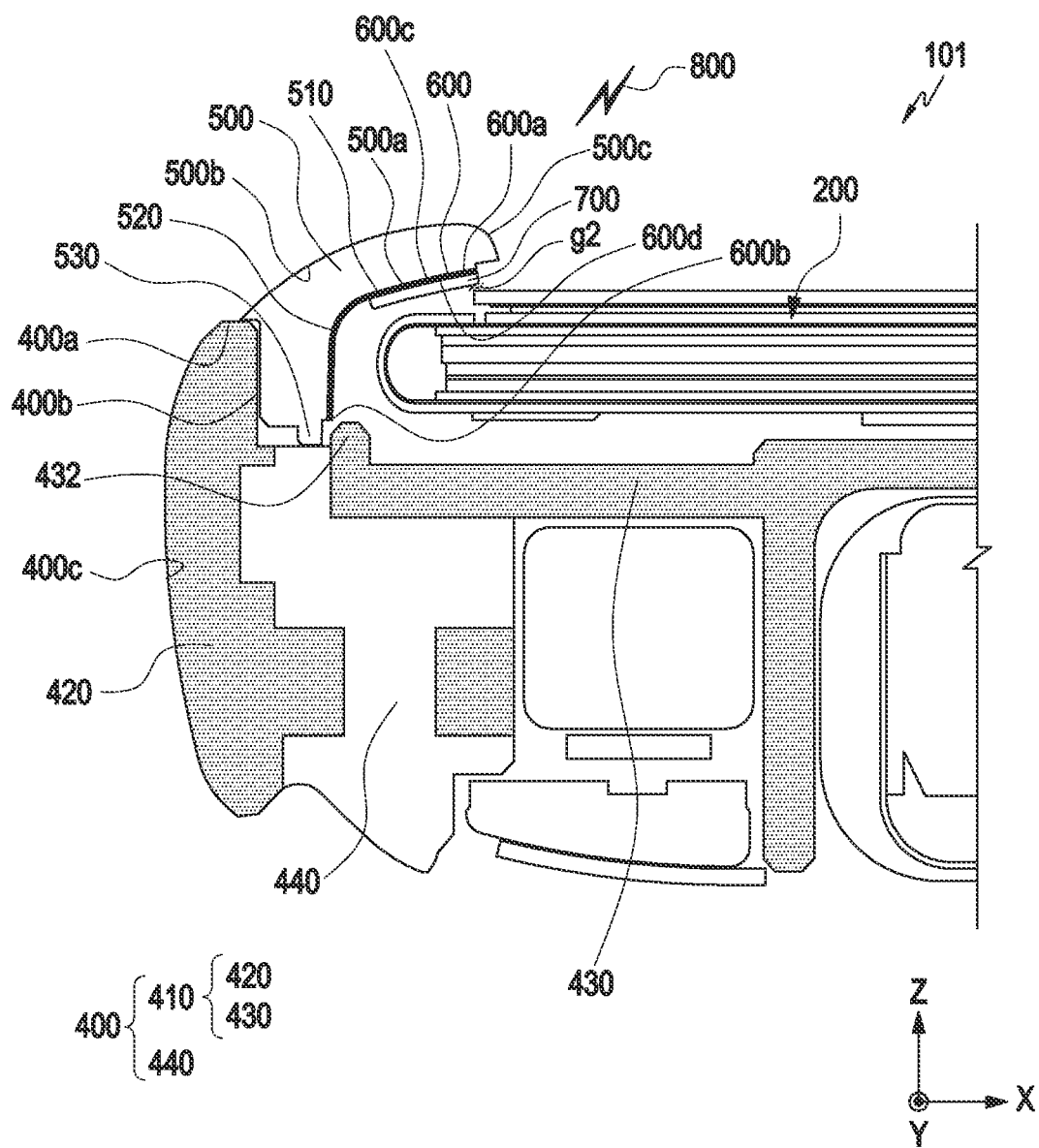
FIG. 6 is a cross-sectional view taken along line A-A' in FIG. 1 according to an embodiment of the disclosure.

FIG. 5 is a cross-sectional view taken along line A-A' in FIG. 1 according to an embodiment of the disclosure. FIG. 6 is a cross-sectional view taken along line A-A' in FIG. 1 according to an embodiment of the disclosure.

Referring to FIGS. 5 and 6, the electronic device 101 may include a support member 400 (e.g., conductive member), a decoration member 500 (e.g., protection member), and a conductive member 600 (e.g., conductive layer). The configuration of the support member 400 of FIGS. 5 and 6 may be wholly or partially the same as the configuration of the foldable housing 300 of FIG. 3.

According to various embodiments of the disclosure, the support member 400 may support components of the electronic device 101. For example, the support member 400 may support the display 200. According to an embodiment of the disclosure, the support member 400 may accommodate the electronic components of the electronic device 101. For example, an electronic component (e.g., a battery (not illustrated)) of the electronic device 101 may be disposed on the support member 400. According to an embodiment of the disclosure, the support member 400 may be connected to the decoration member 500.

According to various embodiments of the disclosure, the support member 400 may form a portion of the outer surface of the electronic device 101. For example, the support member 400 may form a portion of a side surface (e.g., the first side surface 311a or the second side surface 321a in FIG. 1) of the electronic device 101.

According to various embodiments of the disclosure, the support member 400 may be made of a mixture of a conductive material and a insulative material. For example, the support member 400 may include a metal area 410 (e.g., conductive member) made of a metal (e.g., stainless steel or aluminum) and a resin area 440 made of a resin (e.g., plastic). According to an embodiment of the disclosure, the resin area 440 may be molded through injection molding.

According to various embodiments of the disclosure, the metal area 410 of the support member 400 may provide a part of a discharge path. For example, the metal area 410 may provide a ground plane, and may be electrically connected to a ground line provided on a printed circuit board (e.g., the printed circuit board 360 in FIG. 3).

According to various embodiments of the disclosure, interference of radio waves by the resin area 440 of the support member 400 may be less than that of radio waves by the metal area 410. For example, the resin area 440 may be located on the support member 400 to correspond to an antenna structure (not illustrated) of the electronic device 101 so as to provide a path for a signal radiated from the antenna structure. According to an embodiment of the disclosure, the density of the resin area 440 may be less than that of the metal area 410, and the support member 400 including the resin area 440 may be lighter than a support member made only of a metal.

According to various embodiments of the disclosure, the metal area 410 and the resin area 440 of the support member 400 may be positioned in various structures. According to an embodiment of the disclosure, the metal area 410 may include a first metal area 420 forming the rim of the support member 400. The first metal area 420 may include a third support member surface 400c that is a side surface of the support member 400. According to an embodiment of the disclosure, the metal area 410 may include a second metal area 430 configured to support the display 200. The second metal area 430 may accommodate an electronic component (e.g., a battery (not illustrated) or a printed circuit board (not illustrated)) of the electronic device 101. According to an embodiment of the disclosure, the resin area 440 may be located between the first metal area 420 and the second metal area 430.

According to various embodiments of the disclosure, the support member 400 may include at least one protrusion (e.g., a first protrusion 422 or a second protrusion 432) electrically connected to the conductive member 600 to be described below. According to an embodiment (e.g., FIG. 5) of the disclosure, the first metal area 420 may include a first protrusion 422 electrically connected to the conductive member 600. For example, the first metal area 420 may extend in the width direction of the electronic device 101 (e.g., the X-axis direction) to accommodate a part of the decoration member 500 disposed on the support member 400 (e.g., the third decoration member area 530). The first protrusion 422 may extend from the first metal area 420 and protrude toward the conductive member 600. The first protrusion 422 may be integrated with the first metal area 420. According to an embodiment (e.g., FIG. 6) of the disclosure, the second metal area 430 may include a second protrusion 432 electrically connected to the conductive member 600. For example, the second metal area 430 may extend in the width direction of the electronic device 101 (e.g., the X-axis direction) for electrical connection with the conductive member 600. The bottom surface of the decoration member 500 (e.g., the third decoration member area 530) may be coupled with the resin area 540 located between the first metal area 420 and the second metal area 430. The second protrusion 432 may extend from the second metal area 430 and protrude toward the conductive member 600. The second protrusion 432 may be integrated with the second metal area 430.

According to an embodiment of the disclosure, the first protrusion 422 and the second protrusion 432 may be arranged along the longitudinal direction of the electronic device 101 (e.g., the Y-axis direction). According to another embodiment of the disclosure, a plurality of first protrusions 422 and second protrusions 432 may be provided. For example, a plurality of first protrusions 422 or second protrusions 432 may be provided to be spaced apart from each other with reference to a hole (e.g., a through hole 460 in FIG. 8) or a segment portion (e.g., a segment portion 450 in FIG. 8) in the support member 400, respectively.

According to various embodiments of the disclosure, the support member 400 may include at least one of the first protrusion 422 and the second protrusion 432. According to an embodiment of the disclosure, a portion of the support member 400 may include the first protrusion 422, and another portion of the support member 400, which is spaced apart from the first protrusion 422 on the support member 400 in the longitudinal direction of the electronic device 101 (e.g., the Y-axis direction in FIG. 1), may include a second protrusion 432. According to another embodiment of the disclosure, the support member 400 may include only the first protrusion 422 or only the second protrusion 432.

According to various embodiments of the disclosure, the decoration member 500 may surround at least a portion of the display 200. According to an embodiment of the disclosure, the decoration member 500 may surround at least a portion of a space between the support member 400 and the display 200. For example, the decoration member 500 may be disposed on the first support member surface 400*a* and the second support member surface 400*b* of the support member 400, and may cover a portion of the display 200 (e.g., the rim of the display 200). According to an embodiment of the disclosure, the decoration member 500 may be spaced apart from the display 200 in order to prevent a collision with the display 200 when the electronic device 101 is folded. For example, the decoration member 500 may be spaced apart from the display 200 in the thickness direction (e.g., the Z-axis direction) and the width direction (e.g., the X-axis direction).

According to various embodiments of the disclosure, the decoration member 500 may include an inner surface 500*a* of the decoration member facing the inside of the electronic device 101 and an outer surface 500*b* of the decoration member facing the outside of the electronic device 101. The inner surface 500*a* of the decoration member may include a first decoration member area 510 (e.g., conductive side wall portion) facing the support member 400 (e.g., an interior upper surface of the decoration member 500), and a second decoration member area 520 (e.g., conductive support portion) (e.g., an interior side surface of the decoration member 500) extending from the first decoration member area 510 and facing a direction the first decoration member area 510 faces. For example, the second decoration member area 520 may face a side surface of the display 200 (e.g., the bent portion 242 or the bending protection layer 250 in FIG. 4).

According to various embodiments of the disclosure, the decoration member 500 may be made of an insulative material. For example, the decoration member 500 may be made of a resin material (e.g., plastic). According to an embodiment of the disclosure, the electrical conductivity of the decoration member 500 may be lower than that of the metal area 410 or the conductive member 600 of the support member 400.

According to various embodiments of the disclosure, the conductive member 600 may form a discharge path of the electronic device 101. For example, the conductive member 600 may transmit power (e.g., the electrical surge 800) provided to the electronic device 101 from the outside of the electronic device 101 to the ground. For example, the conductive member 600 may be electrically connected to the metal area 410 of the support member 400. The description "electrically connected" herein may be used to define structures that are directly connected to (e.g., in contact with) each other, or structures that are sufficiently close to each other to be capable of causing movement of electrons according to current.

According to various embodiments of the disclosure, the conductive member 600 may be disposed on the decoration member 500. For example, the conductive member 600 may be disposed on the inner surface 500*a* of the decoration member. The inner surface 500*a* of the decoration member may face a portion (e.g., the first decoration member area 510) of the decoration member 500 that faces the bending protection layer (e.g., the bending protection layer 250 in FIG. 4) or the bent portion (e.g., the bent portion 242 in FIG. 4) of the display 200). According to an embodiment of the disclosure, the conductive member 600 may face the bending protection layer 250 or the bent portion 242. It is possible to reduce the electrical surge 800 introduced into the first separation space (e.g., the first separation space g1 in FIG. 4) by the conductive member 600 facing the bending protection layer 250 or the bent portion 242.

According to various embodiments of the disclosure, the conductive member 600 may extend parallel to the folding axis (e.g., the folding axis A in FIG. 1) of the electronic device 101. For example, the conductive member 600 may extend along the longitudinal direction (e.g., the Y-axis direction) of the electronic device 101.

According to various embodiments of the disclosure, the conductive member 600 may include at least one of a conductive sheet, a conductive fabric, a conductive film, a conductive paint, or a plating layer. According to an embodiment of the disclosure, the conductive sheet may be a sheet including a conductive metal (e.g., at least one of copper, nickel, gold, silver, or aluminum). According to an embodiment of the disclosure, the conductive fabric may be made of a woven fabric or a non woven fabric. The conductive fabric may include threads and fibers of a metal (e.g., at least one of copper, nickel, gold, silver, or aluminum). According to an embodiment of the disclosure, the conductive film may be a film including a conductive material (e.g., at least one of copper, nickel, gold, silver, or aluminum). According to an embodiment of the disclosure, the conductive film may be a paint including particles of a metal (e.g., at least one of copper, nickel, gold, silver, or aluminum). According to an embodiment of the disclosure, the conductive member 600 may be interpreted as a printing layer including a conductive paint. For example, the conductive member 600 may be a conductive ink remaining after being applied using a dispenser together with a resin material, and then evaporating the resin material using a laser. According to an embodiment of the disclosure, the conductive member 600 may be a plating layer. For example, the conductive member 600 may be a plating layer disposed on a pattern formed using a laser.

According to various embodiments of the disclosure, the conductive member 600 may be a conductive material formed on the decoration member 500 through vapor deposition. According to an embodiment of the disclosure, the conductive member 600 may be a film or coating obtained through vapor deposition of a conductive material (e.g., at least one of copper, nickel, gold, silver, or aluminum) on the decoration member 500. For example, the conductive member 600 may be integrated with the decoration member 500 by being vapor-deposited on the inner surface 500a of the first decoration member area 510.

According to various embodiments of the disclosure, the electronic device 101 may include an insulative member 700 for blocking foreign matter flowing into the second separation space g2 between the decoration member 500 and the display 200. According to an embodiment of the disclosure, the insulative member 700 may be an elastic porous material (e.g., sponge) or a buffer material (e.g., mohair or brush).

According to various embodiments of the disclosure, the insulative member 700 may be disposed on the conductive member 600. For example, the conductive member 600 may be disposed between the decoration member 500 and the insulative member 700 made of a resin material. According to an embodiment of the disclosure, the insulative member 700 may face the first decoration member area 510 of the decoration member 500. For example, the insulative member 700 may be disposed on a portion of the conductive member 600 (e.g., a first conductive member 610 of FIG. 7A). According to an embodiment of the disclosure, the decoration member 500 and the insulative member 700 may guide the flow of power (e.g., the electrical surge 800) transmitted to the conductive member 600. For example, the decoration member 500 and the insulative member 700 may cover the first surface 600c of the conductive member 600 facing the decoration member 500 and the second surface 600d of the conductive member 600 facing the display 200, thereby reducing the power emitted through the first surface 600c or the second surface 600d. According to an embodiment of the disclosure, the conductive member 600 may include a first end 600a exposed to the outside of the electronic device 101 and a second end 600b located opposite to the first end 600a and facing the metal area 410. The power transmitted to the first end 600a of the conductive member 600 may be transmitted to the second end 600b located opposite to the first end 600a.

FIGS. 5 and 6 illustrate the structure in which the support member 400, the decoration member 500, the conductive member 600, and the insulative member 700 of the electronic device 101 are located at the left side of the electronic device 101 of FIG. 1 (e.g., the cross section of the first housing 310 (e.g., line A-A'), but this is merely an example for description, and the structure of the disclosure is not limited thereto. According to an embodiment of the disclosure, the support member 400, the decoration member 500, the conductive member 600, and the insulative member 700 may be disposed in a housing in which the bending protection layer 250 or the bent portion 242 is located (e.g., the first housing 310 or the second housing 320 in FIG. 1). For example, when the bending protection layer 250 or the bending part 242 of the display 200 is located at the right side of the electronic device 101, the support member 400, the decoration member 500, the conductive member 600, and the insulative member 700 of the electronic device 101 may be located at the right side of the electronic device 101 (e.g., the second housing 320, the +X direction) of FIG. 1.

Figure 7A:
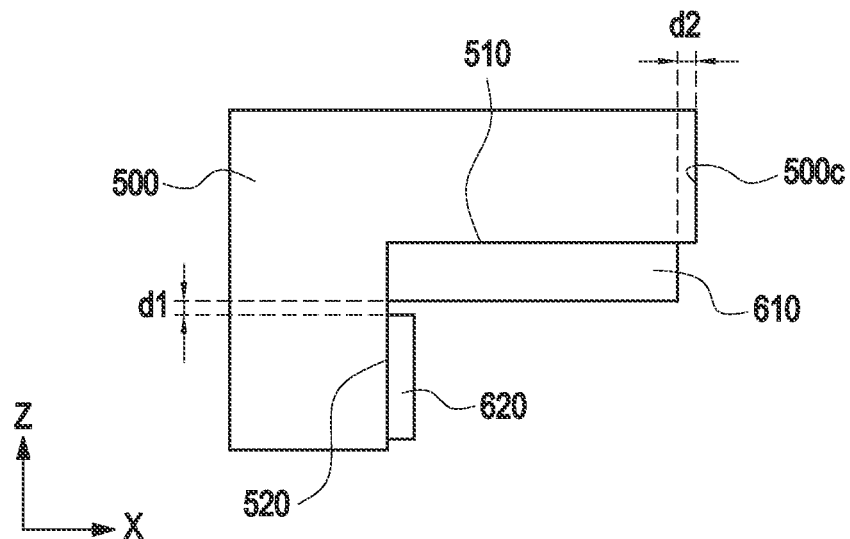
FIG. 7A is a view illustrating a conductive member coupled to a decoration member according to an embodiment of the disclosure.
Figure 7B:
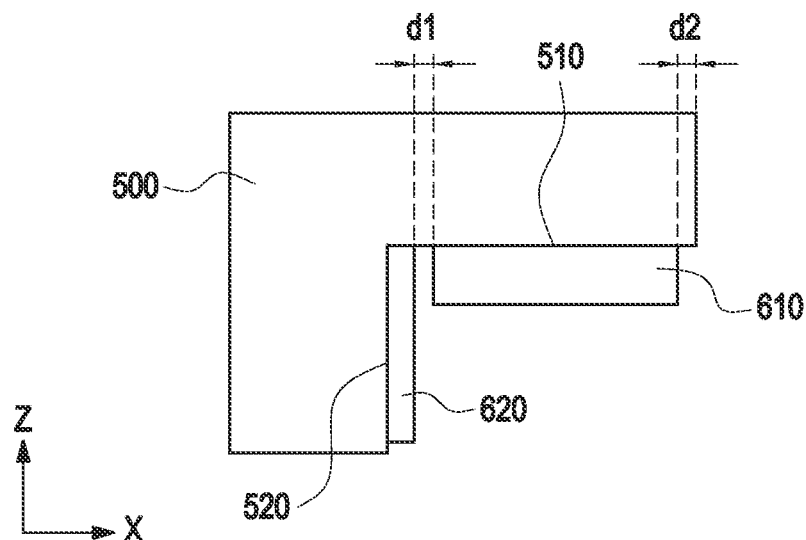
FIG. 7B is a view illustrating a conductive member coupled to a decoration member according to an embodiment of the disclosure.
Figure 7C:
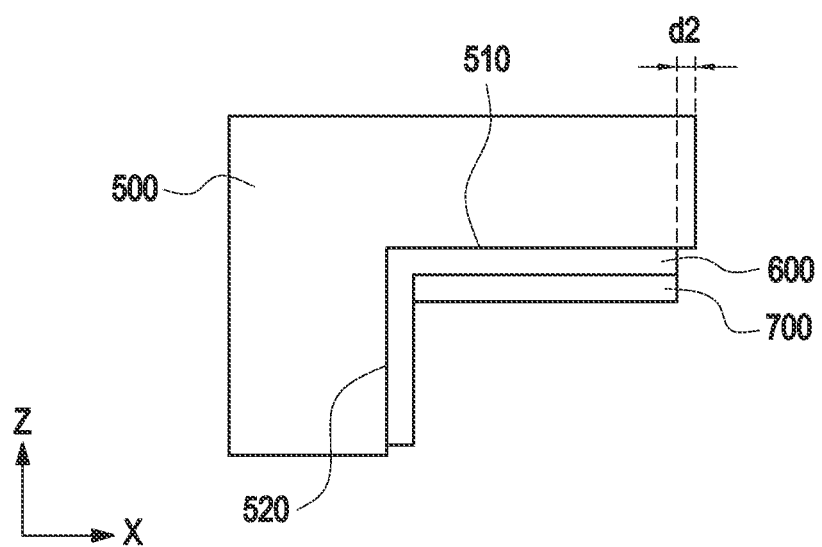
FIG. 7C is a view illustrating a conductive member coupled to a decoration member according to an embodiment of the disclosure.

FIG. 7A is a view illustrating a conductive member coupled to a decoration member according to an embodiment of the disclosure, FIG. 7B is a view illustrating a conductive member coupled to a decoration member according to an embodiment of the disclosure, and FIG. 7C is a view illustrating a conductive member coupled to a decoration member according to an embodiment of the disclosure.

Referring to FIGS. 7A to 7C, the conductive member 600 may be disposed on the decoration member 500 in various structures. The configuration of the decoration member 500, the conductive member 600, and the insulative member 700 of FIGS. 7A, 7B and 7C may be wholly or partially the same as the configuration of the decoration members 500, the conductive member 600, and the insulative member 700 of FIGS. 5 and 6.

According to various embodiments of the disclosure, the conductive member 600 may include a plurality of conductive members (e.g., the first conductive member 610 and the second conductive member 620) arranged parallel to each other. For example, the first conductive member 610 may be disposed on the first decoration member area 510, and the second conductive member 620 may be disposed on the second decoration member area 520. According to an embodiment of the disclosure, the first conductive member 610 and the second conductive member 620 may be electrically connected to each other. For example, the power transmitted to the first conductive member 610 may be transmitted to the second conductive member 620.

According to various embodiments of the disclosure, the first conductive member 610 and the second conductive member 620 may be spaced apart from each other by a first distance d1. The first distance d1 may be a distance at which the power applied to the first conductive member 610 can be transmitted to the second conductive member 620 due to external electrical stimulation (e.g., static electricity). According to an embodiment (e.g., FIG. 7A) of the disclosure, the first conductive member 610 may extend from the first decoration member area 510 to the second decoration member area 520, and the second conductive member 620 may be disposed on the second decoration member area 520. According to another embodiment (e.g., FIG. 7B) of the disclosure, the second conductive member 620 may extend from the second decoration member area 520 to the first decoration member area 510, and the first conductive member 610 may be disposed on the first decoration member area 510. According to another embodiment (not illustrated) of the disclosure, the first conductive member 610 and the second conductive member 620 may be in contact with each other.

According to various embodiments of the disclosure, the conductive member 600 may be integrated with each other. Referring to FIG. 7C, the conductive member 600 may be manufactured in a curved shape to correspond to the curved decoration member 500. The conductive member 600 may extend from the first decoration member area 510 to the second decoration member area 520.

According to various embodiments of the disclosure, the first conductive member 610 may be spaced apart from an end 500c of the decoration member 500 by a second distance d2. According to an embodiment of the disclosure, the second distance d2 may be 500 μm or less. For example, the second distance d2 may be 150 μm or less. For example, the decoration member 500 may extend or protrude more than the conductive member 600 in the width direction of the electronic device 101 (e.g., the X-axis direction) by a second distance d2. Since the electrical surge transmitted to the first conductive member 610 (e.g., the electrical surge 800 of FIG. 5) is transmitted to the support member (e.g., the support member 400 in FIG. 5) via the second conductive member 620, the second distance d2 may be decreased, and the width of the decoration member 500 may be decreased.

According to various embodiments of the disclosure, the insulative member 700 may be disposed on at least a portion of the conductive member 600. For example, the insulative member 700 may be disposed on the first conductive member 610 or the second conductive member 620. In another example (e.g., FIG. 7C), the insulative member 700 may be disposed on a portion of the integrated conductive member 600. As another example, the insulative member 700 may cover of the entire conductive member 600. According to an embodiment of the disclosure, the insulative member 700 may be disposed under the conductive member 600. For example, the conductive member 600 may protrude more than the insulative member 700 in the width direction of the electronic device 101 (e.g., the X-axis direction), or may be located substantially on the same line as the insulative member 700. The insulative member 700 may be disposed such that the insulative member 700 does not protrude more than the conductive member 600 in the width direction of the electronic device 101 (e.g., the X-axis direction).

Each of FIGS. 7A, 7B, and 7C illustrates a structure in which the first decoration member area 510 of the decoration member 500 is perpendicular to the second decoration member area 520, but the angle between the first decoration member area 510 and the second decoration member area 520 is not limited to 90 degrees. For example, the first decoration member area 510 and the second decoration member area 520 may be areas facing different directions on the inner surface of the decoration member 500 (e.g., the inner surface 500a of the decoration member in FIG. 5).

According to an embodiment of the disclosure, the material of the first conductive member 610 and the second conductive material may be different from each other. For example, the first conductive member 610 may be made of a conductive fabric, and the second conductive member 620 may be made of a conductive sheet. As another example, the first conductive member 610 may be made of a conductive sheet, and the second conductive member 620 may be made of a conductive member. According to another embodiment of the disclosure, the material of the first conductive member 610 and the material of the second conductive member 620 may be the same. For example, the first conductive member 610 and the second conductive member 620 may be made of a conductive sheet containing copper.

Figure 8:
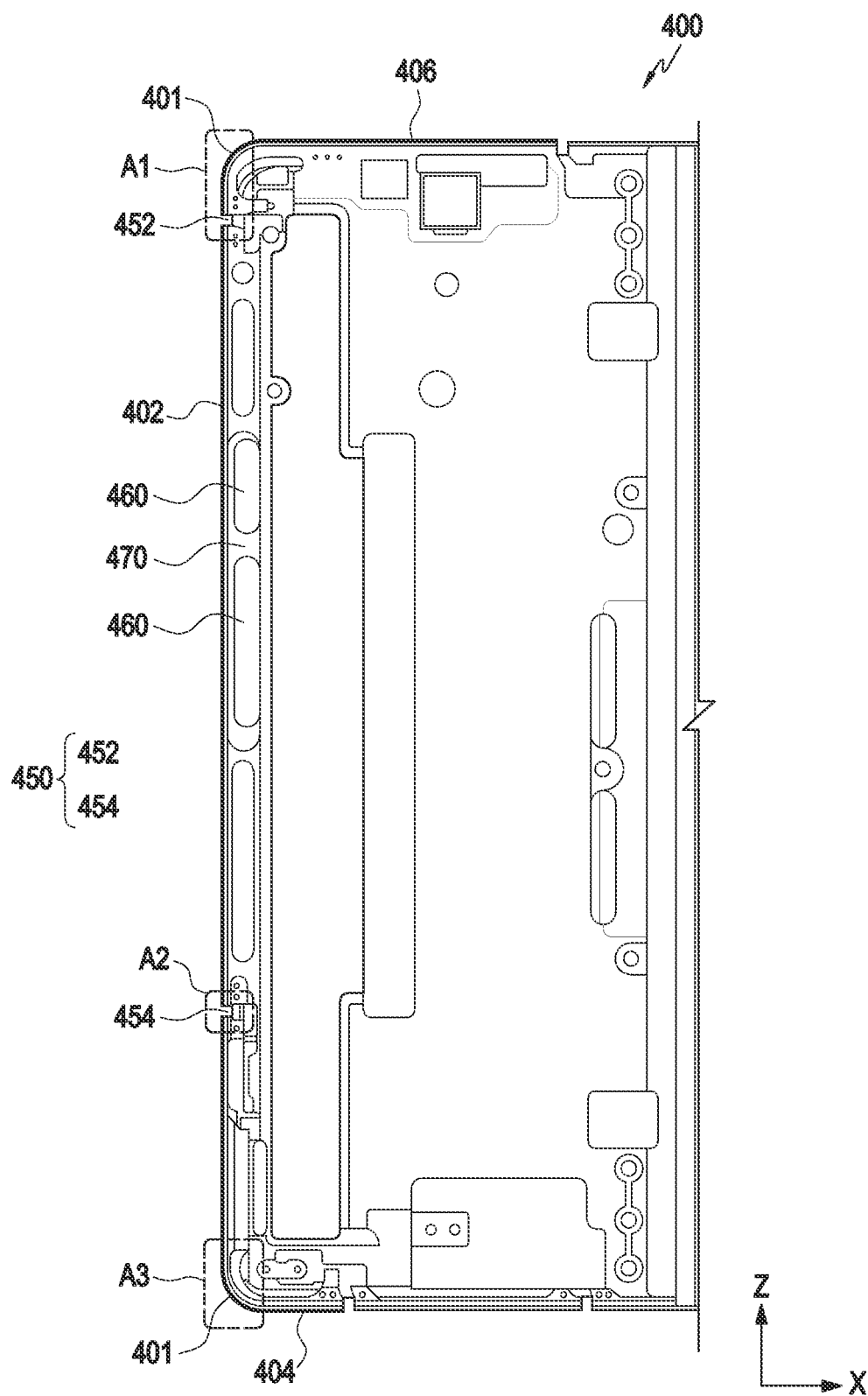
FIG. 8 is a front view of a support member according to an embodiment of the disclosure.
Figure 9A:
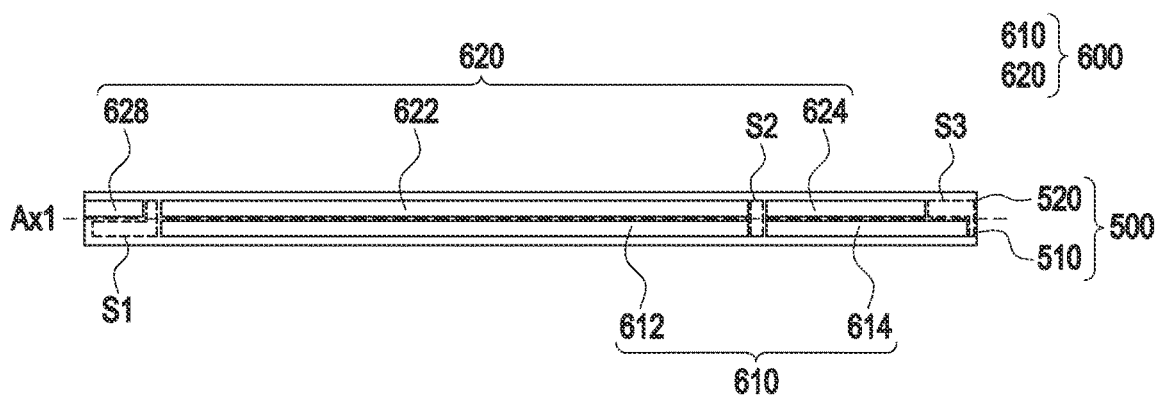
FIG. 9A is a view illustrating a conductive member arranged to correspond to a support member according to an embodiment of the disclosure.
Figure 9B:
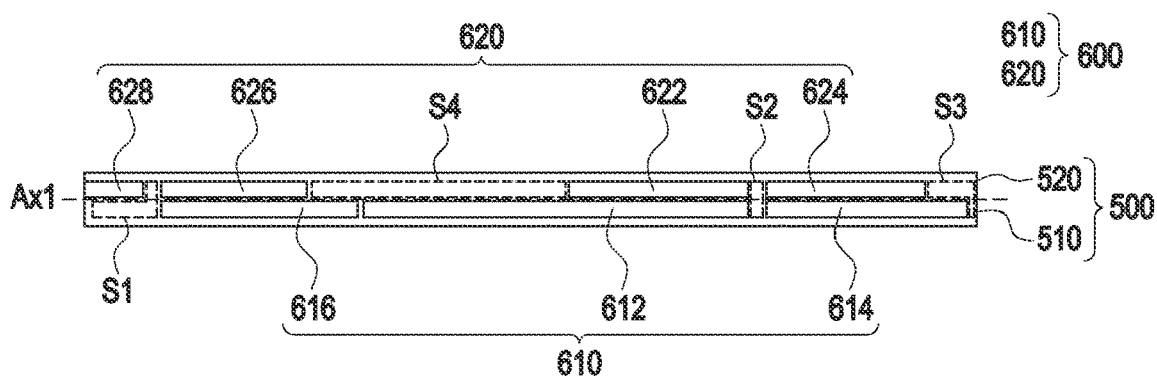
FIG. 9B is a view illustrating a conductive member arranged to correspond to a support member according to an embodiment of the disclosure.
Figure 9C:
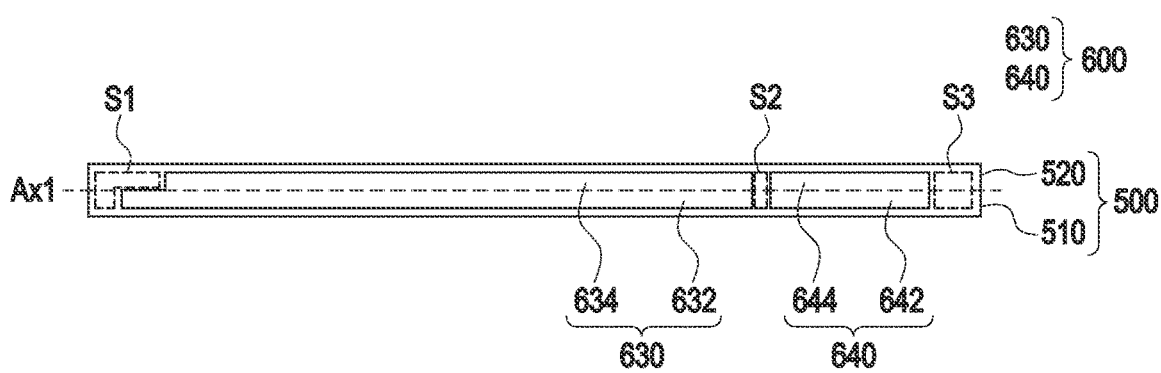
FIG. 9C is a view illustrating a conductive member arranged to correspond to a support member according to an embodiment of the disclosure.

FIG. 8 is a front view of a portion of a support member according to an embodiment of the disclosure. FIG. 9A is a view illustrating a conductive member arranged to correspond to a support member according to an embodiment of the disclosure, FIG. 9B is a view illustrating a conductive member arranged to correspond to a support member according to an embodiment of the disclosure, and FIG. 9C is a view illustrating a conductive member arranged to correspond to a support member according to an embodiment of the disclosure.

Referring to FIGS. 8, 9A, 9B, and 9C, the conductive member 600 may be arranged to correspond to the support member 400. For example, the support member 400 may include a insulative configuration (e.g., the segment portion 450 or the injection-molded area (i.e., the second metal area 430) in FIG. 5) and a conductive configuration (e.g., the metal area 410 in FIG. 5), the conductive member 600 may face the conductive configuration, and the decoration member 500, which is exposed because the conductive member 600 is not disposed, may face the insulative configuration. The configuration of the support member 400 of FIGS. 8 and 10 may be wholly or partially the same as the configuration of the support member 400 of FIGS. 5 and 6, and the configuration of the conductive member 600 of FIGS. 9A to 9C, and 10 may be wholly or partially the same as the configuration of the conductive member 600 of FIGS. 5 and 6.

According to various embodiments of the disclosure, the support member 400 may include the segment portion 450. According to an embodiment of the disclosure, the support member 400 may include a plurality of rims spaced apart from each other (i.e., a first rim 402, a second rim 404, and a third rim 406). A partial area of the support member 400 at which the plurality of edges 402, 404, and 406 are spaced apart from each other (e.g., a first area A1 or a second area A2) may be defined as the segment portion 450. According to an embodiment of the disclosure, a portion of the first metal area of the support member 400 (e.g., the first metal area 420 in FIG. 5) is spaced apart, and a position at which the first metal area 420 is spaced apart may be defined as the segment portion 450. According to an embodiment of the disclosure, the resin area of the support member 400 (e.g., the resin area 440 in FIG. 5) may be located in the segment portion 450, and may form a portion of the rim of the support member 400.

According to various embodiments of the disclosure, the metal area of the support member 400 (e.g., the metal area 410 in FIG. 5) may include the through hole 460 for providing a path of a radio frequency (RF) signal. According to an embodiment of the disclosure, the resin area of the support member 400 (e.g., the resin area 440 in FIG. 5) may be located in the through hole 460. According to an embodiment of the disclosure, the resin area 440 disposed in the through hole 460 may directly face the conductive member 600. According to an embodiment of the disclosure, the support member 400 may include a plurality of through holes (e.g., the through hole 460) spaced apart from each other with reference to a bridge 470.

According to various embodiments of the disclosure, the support member 400 may have different thicknesses. For example, the thickness of at least one of areas defining at least a portion of corner portion 401 of the support member 400 (e.g., the first area A1 or the third area A3) may be smaller than the thickness of another area of the support member (e.g., the second area A2). According to an embodiment of the disclosure, at least a portion of the resin area of the corner portion (e.g., the resin area 440 in FIG. 5) may be excluded.

According to various embodiments of the disclosure, the conductive member 600 may include a first conductive member 610 and the second conductive member 620, which face different directions with reference to the bending axis Ax1 of the decoration member 500. The first conductive member 610 may be disposed on the first decoration member area 510, and the second conductive member 620 may be disposed on the second decoration member area 520. For example, the second conductive member 620 may be arranged along a rim of the support member 400 (e.g., the first rim 402), and the first conductive member 610 may be arranged parallel to the second conductive member 620. As another example, the first conductive member 610 and the second conductive member 620 may be disposed to be in contact with each other. FIGS. 9A, 9B, and 9C illustrate the first decoration member area 510 and the second decoration member area 520 as flat surfaces for convenience of description. However, the second decoration member area 520 may be curved relative to the first decoration member area 510 with reference to a bending axis Ax1 (e.g., FIG. 5). According to an embodiment of the disclosure, the bending axis Ax1 may be an axis extending parallel to the folding axis (e.g., the folding axis A in FIG. 1) of the electronic device (e.g., the electronic device 101 of FIG. 1).

According to various embodiments of the disclosure, the decoration member 500 may directly face a portion of the support member 400 (e.g., the first area A1 or the second area A2) in which the segment portion 450 is located. According to an embodiment of the disclosure, the decoration member 500 may include a first portion S1 facing the first area A1 of the support member 400 in which a first segment portion 452 is located and a second portion S2 facing the second area A2 of the support member 400 in which a second segment portion 454 is located. For example, the first portion S1 may cover at least a portion of the first area A1 (e.g., the first segment portion 452), and the second portion S2 may cover at least a portion of the second area A2 (e.g., the second segment portion 454). The second portion S2 may be an area of the decoration member 500 exposed to a space between a (1-1)th conductive member 612 and a (1-2)th conductive member 614 or a space between a (2-1)th conductive member 622 and a (2-2)th conductive member 624.

According to various embodiments of the disclosure, the decoration member 500 may directly face a portion of the support member 400 (e.g., the first area A1 or the third area A3) defining the portion of the corner portion 401. According to an embodiment of the disclosure, the decoration member 500 may include a first portion S1 facing the first area A1 and a third portion S3 facing the third area A3. The first portion 51 and the third portion S3 may be exposed to the outside of the decoration member 500. For example, the conductive member 600 may not be disposed on the first portion S1 and the third portion S3.

According to various embodiments of the disclosure, the decoration member 500 may directly face the through hole 460 in the support member 400. For example, the decoration member 500 may include a fourth portion S4 facing the through hole 460. The fourth part S4 may be exposed to the outside of the decoration member 500. For example, the conductive member 600 may not be disposed on the fourth portion S4.

According to various embodiments of the disclosure, the conductive member 600 may be disposed to correspond to the segment portion 450 of the support member 400. For example, the conductive member 600 may include a plurality of conductive members spaced apart from each other with reference to the segment portion 450. According to an embodiment of the disclosure, the first conductive member 610 may include a (1-1)th conductive member 612 and a (1-2)th conductive member 614 spaced apart from each other with reference to the segment portion 450, and the second conductive member 620 may include a (2-1)th conductive member 622 and a (2-2)th conductive member 624 spaced apart from each other with reference to the segment portion 450. For example, the (1-1)th conductive member 612 and the (1-2)th conductive member 614 may be spaced apart from each other with reference to the second portion S2, and the (2-1)th conductive member 622 and the (2-2)th conductive member 624 may be spaced apart each other with reference to the second portion S2. According to another embodiment of the disclosure, at least one of the first conductive member 610 or the second conductive member 620 may disposed to correspond to a plurality of segment portions (e.g., the first segment portion 452 and the second segment portion 454). For example, the second conductive member 620 may include at least one of a (2-1)th conductive member 622, a (2-2)th conductive member 624, a (2-3)th conductive member 626, or a (2-4)th conductive member (628). The (2-1)th conductive member 622 and the (2-2)th conductive member 624 may be spaced apart from each other with reference to the second portion S2 overlapping the second segment portion 454, and The (2-3)th conductive member 626 and the (2-4)th conductive member 628 may be spaced apart from each other with reference to the first portion S1 overlapping the first segment portion 452.

According to various embodiments of the disclosure, a plurality of conductive members spaced apart from each other to correspond to the segment portion 450 may be electrically connected to each other. For example, the (1-1)th conductive member 612 and the (1-2)th conductive member 614 may be electrically connected to each other, and the (2-1)th conductive member 622 and the (2-2)th conductive member 624 may be electrically connected to each other. As another example, the (1-3)th conductive member 616 and the (1-1)th conductive member 612 may be electrically connected to each other, and the (2-3)th conductive member 626 and the (2-1)th conductive member 622 may be electrically connected to each other.

According to various embodiments of the disclosure, the conductive member 600 may be electrically connected via another conductive member 600 that is parallel thereto. According to an embodiment (e.g., FIG. 9B) of the disclosure, the (2-1)th conductive member 622 may be electrically connected to the (2-3)th conductive member 626 via the (1-1)th conductive member 612 and the (1-3)th conductive member 616. For example, the (2-1)th conductive member 622 may be electrically connected to the (1-1)th conductive member 612, the (2-3)th conductive member 626 may be electrically connected to the (1-3)th conductive member 616, and the (1-1)th conductive member 612 may be electrically connected to the (1-3)th conductive member 616. According to another embodiment (not illustrated) of the disclosure, the (1-1)th conductive member 612 and the (1-3)th conductive member 616 may be integrated as a first conductive member 610, and the (2-1)th conductive member may be electrically connected to the (2-3)th conductive member 626 via the first conductive member 610.

According to various embodiments of the disclosure, the conductive member 600 may include a third conductive member 630 and a fourth conductive member 640 spaced apart from each other with reference to the segment portion 450 or the second portion S2 facing the segment portion 450. The third conductive member 630 may be disposed on the first decoration member area 510 and the second decoration member area 520 of the decoration member 500, and the fourth conductive member 640 may be disposed on the first decoration member area 510 and the second decoration member area 520 of the decoration member 500. For example, the third conductive member 630 may include a (3-1)th conductive member 632 disposed in the first decoration member area 510, and a (3-2)th conductive member 634 disposed in the second decoration member area 520, and the fourth conductive member 640 may include a (4-1)th conductive member 642 disposed in the first decoration member area 510, and a (4-2)th conductive member 644 disposed in the second decoration member area 520. According to an embodiment of the disclosure, the (3-1)th conductive member 632 and the (3-2)th conductive member 634 are integrated with each other, and the (4-1)th conductive member 642 and the (4-2)th conductive member 644 may be integrated with each other. According to an embodiment of the disclosure, the third conductive member 630 and the fourth conductive member 640 may be electrically connected to each other.

According to various embodiments of the disclosure, the conductive member 600 may be disposed to correspond to the portion of the corner portion 401 of the support member 400. For example, the first conductive member 610 and the second conductive member 620 may not be disposed on the first portion S1 and the third portion S3, which face at least a portion of the corner portion 401. According to an embodiment of the disclosure, the area of the third portion S3 in the second decoration member area 520 may be larger than the area of the third portion S3 in the first decoration member area 510. For example, the area of the (1-2)th conductive member 614 facing electrical surge (e.g., the electrical surge 800 in FIG. 5) applied from the outside of the electronic device (e.g., the electronic device 101 in FIG. 1) may be larger than the area of the (2-2)th conductive member 624 facing the support member (e.g., the support member 400 in FIG. 5).

According to various embodiments of the disclosure, the conductive member 600 may be disposed to correspond to the through hole 460 in the support member 400. For example, the second conductive member 620 may include a (2-1)th conductive member 622 and a 2-3rd conductive member 626 spaced apart from each other with reference to the fourth portion S4. According to an embodiment of the disclosure, at least a portion of external electrical surge (e.g., the electrical surge 800 in FIG. 5) transmitted to a partial area of the first conductive member 610 (e.g., the (1-1)th conductive member 612) adjacent to the fourth portion S4 may be transmitted to the (2-3)th conductive member 626 via the (2-1)th conductive member 622 and the (1-3)th conductive member 616.

Figure 10:
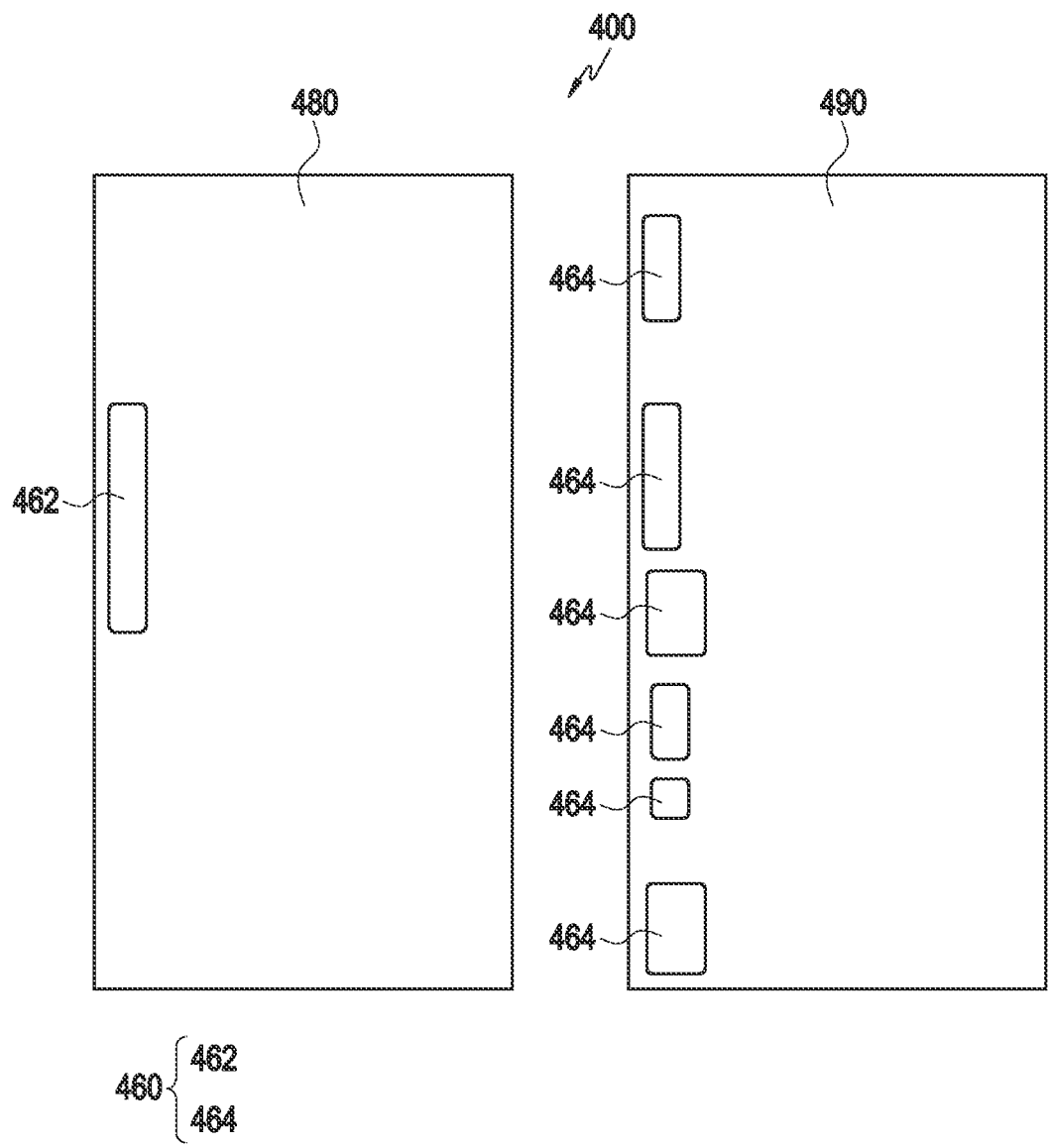
FIG. 10 is a schematic view of a support member according to an embodiment of the disclosure.

FIG. 10 is a schematic view of a support member according to an embodiment of the disclosure.

Referring to FIG. 10, the support member 400 may include a plurality of through holes (e.g., the through hole 460). For example, the metal area of the support member 400 (e.g., the metal area 410 in FIG. 5) may include an upper metal area 480 and a lower metal area 490, and the support member 400 may include an upper metal area 480, a lower metal area 490, and a resin area located between the upper metal area 480 and the lower metal area 490 (e.g., the resin area in FIG. 5). The configuration of the support member 400 of FIG. 10 may be wholly or partially the same as the configuration of the support member 400 of FIGS. 5 and 8.

According to various embodiments of the disclosure, the through hole 460 in the support member 400 may include at least one first through hole 462 configured in the upper metal area 480 facing the front surface (e.g., the first surface 310a and the third surface 320a in FIG. 1) of the electronic device (e.g., the electronic device 101 in FIG. 1), and second through holes 464 configured in the lower metal area 490 facing the rear surface (e.g., the second surface 310b and the fourth surface 320b in FIG. 1) of the electronic device 101. According to an embodiment of the disclosure, the support member 400 may include the through hole 460 in order to reduce or prevent interference with a radio frequency signal generated from an electronic component (e.g., an antenna (not illustrated)) of the electronic device (e.g., the electronic device 101 in FIG. 1).

According to various embodiments of the disclosure, the ratio of the metal area (e.g., the metal area 410 in FIG. 5) to the resin area (e.g., the resin area 440 in FIG. 5) of the upper metal area 480 may be greater than the ratio of the metal area 410 to the resin area 440 of the lower metal area 490. For example, the total area of the second through holes 464 configured in the lower metal area 490 may be greater than the area of the first through hole 462 formed in the upper metal area 480. As another example, the number of second through holes 464 may be greater than the number of first through holes 462. According to an embodiment of the disclosure, as the ratio of the metal area (e.g., the metal area 410 in FIG. 5) to the resin area (e.g., the resin area 440 in FIG. 5) of the upper metal area 480 increases compared to the ratio of the metal area 410 to the resin area 440 of the lower metal area 490, the area of the support member 400 electrically connected to the conductive member (e.g., the conductive member 600 in FIG. 5) may increase.

Figure 11:
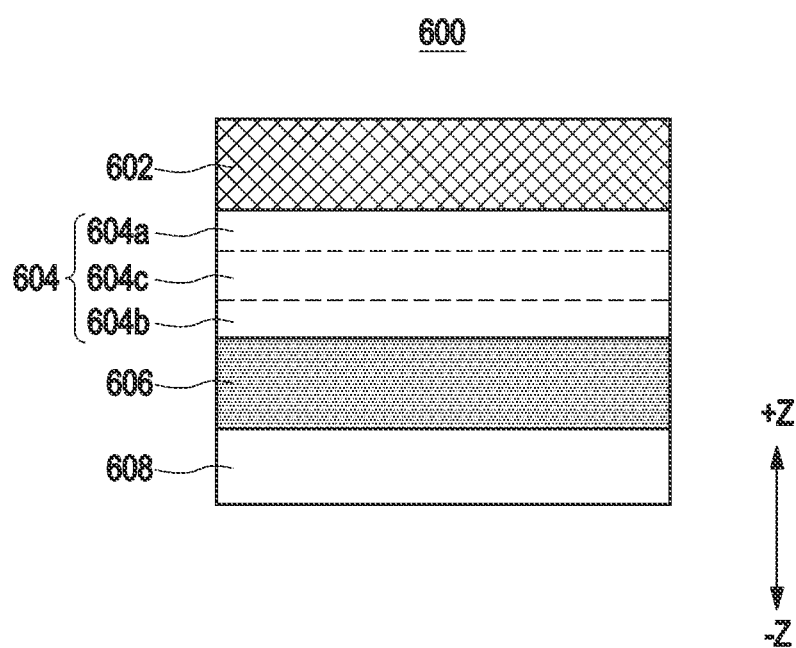
FIG. 11 is a cross-sectional view of a conductive member according to an embodiment of the disclosure.

FIG. 11 is a cross-sectional view of a conductive member according to an embodiment of the disclosure.

Referring to FIG. 11, the conductive member 600 may include a shield layer 602, a metal layer 604, a conductive adhesive layer 606 and/or a release tape 608. The configuration of the conductive member 600 of FIG. 11 may be wholly or partially the same as the configuration of the conductive member 600 of FIGS. 5 and 6.

According to various embodiments of the disclosure, the shield layer 602 may reduce or prevent visibility of a portion of the conductive member 600 (e.g., the metal layer 604) to the outside of the electronic device (e.g., the electronic device 101 in FIG. 1). According to an embodiment of the disclosure, the shield layer 602 may face a decoration member (e.g., the decoration member 500 in FIG. 5). According to an embodiment of the disclosure, the shield layer 602 may be an insulative black tape.

According to various embodiments of the disclosure, the metal layer 604 may include a conductive metal. According to an embodiment of the disclosure, the metal layer 604 may include a first metal layer 604a, a second metal layer 604b, and a third metal layer 604c disposed between the first metal layer 604a and the second metal layer 604b disposed below the shield layer 602. The first metal layer 604a and the second metal layer 604b may include nickel (Ni). The third metal layer 604c may include copper (Cu). For example, the metal layer 604 may be interpreted as a plating layer of nickel, copper, and nickel. According to an embodiment of the disclosure, the first metal layer 604a and/or the second metal layer 604b may reduce or prevent the visibility of the third metal layer 604c made of copper to the outside of the electronic device (e.g., the electronic device 101 in FIG. 1).

According to various embodiments of the disclosure, the conductive member 600 may be attached to the insulative member (e.g., the insulative member 700 in FIGS. 5 and 6) using a conductive adhesive layer 606. According to an embodiment of the disclosure, the release tape 608 disposed under the conductive adhesive layer 606 may be removed from the conductive adhesive layer 606. The release tape 608 may be removed from the conductive adhesive layer 606, and the conductive member 600 may be bonded to the insulative member 700 using the conductive adhesive layer 606. According to an embodiment of the disclosure, the conductive adhesive layer 606 may include a conductive metal. For example, the conductive adhesive layer 606 may include a nickel filler.

Figure 12:
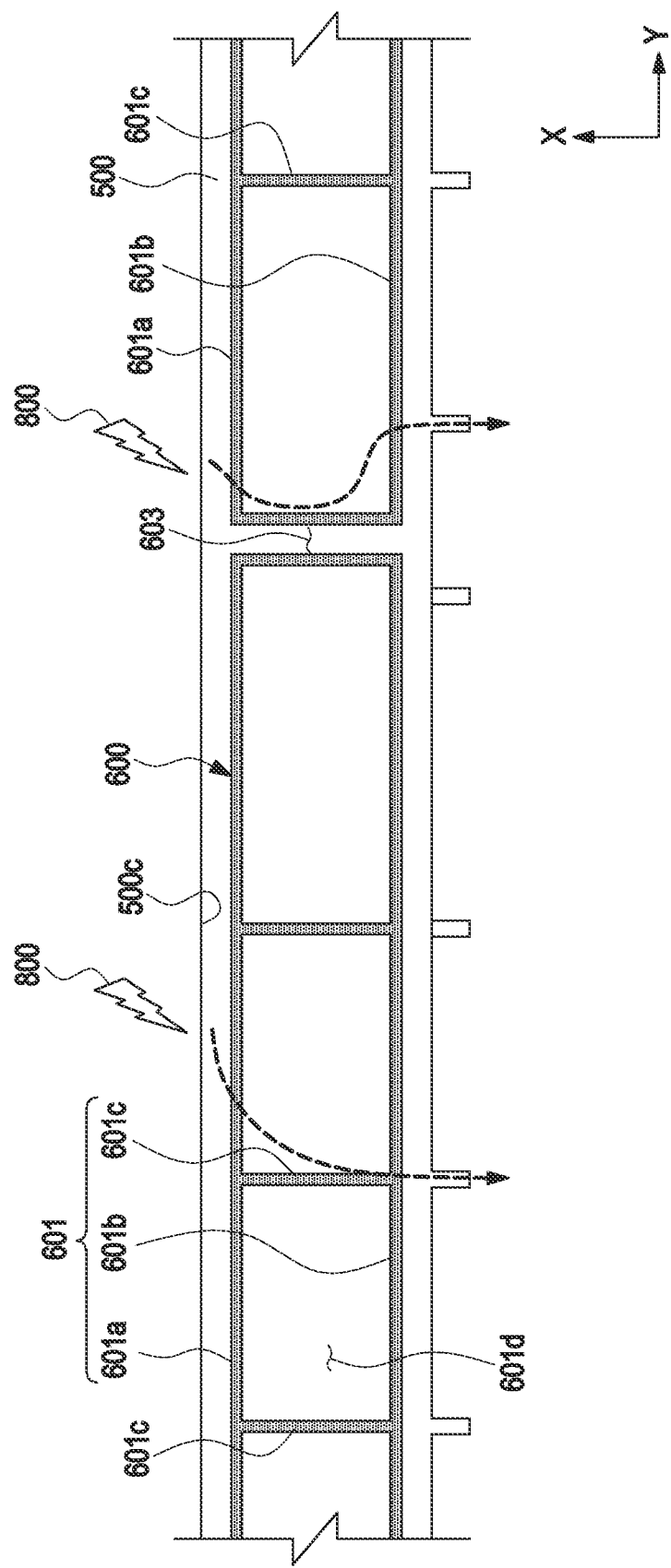
FIG. 12 is a schematic view of a conductive member disposed on a decoration member according to an embodiment of the disclosure.

FIG. 12 is a schematic view of a conductive member disposed on a decoration member according to an embodiment of the disclosure.

Referring to FIG. 12, the electronic device 101 may include a decoration member 500 and a conductive member 600. The configuration of the decoration member 500 and the conductive member 600 of FIG. 12 may be wholly or partially the same as the configuration of the decoration member 500 and the conductive member 600 of FIGS. 5 and 6.

According to various embodiments of the disclosure, the conductive member 600 may include at least one pattern structure 601. According to an embodiment of the disclosure, the pattern structure 601 may be interpreted as a plating layer or a metal layer formed using a laser. According to an embodiment of the disclosure, the pattern structure 601 may include a first conductive line 601a adjacent to the end 500c of the decoration member 500, a second conductive line 601b spaced apart from the first conductive line 601a, and a third conductive line 601c connected to the first conductive line 601a and the second conductive line 601b. According to an embodiment of the disclosure, the first conductive line 601a and the second conductive line 601b may be substantially parallel to each other. According to an embodiment of the disclosure, the pattern structure 601 may define at least one closed curve. For example, the first conductive line 601a, the second conductive line 601b, and the third conductive line 601c may surround an inner space 601d. According to an embodiment of the disclosure, at least a part of electrical surge 800 transmitted to the first conductive line 601a of the conductive member 600 may be transmitted to the second conductive line 601b via the third conductive line 601c. According to an embodiment of the disclosure, the first conductive line 601a may form at least a portion of the first end of the conductive member 600 (e.g., the first end 600a in FIG. 5), and the second conductive line 601b may form at least a portion of the second end of the conductive member 600 (e.g., the second end 600b in FIG. 5). According to an embodiment of the disclosure, the conductive member 600 may include a segment portion 603 disposed between a plurality of pattern structures 601. Since the plurality of pattern structures 601 may be spaced apart from each other by the segment portion 603, radiation performance is capable of increasing.

According to various embodiments of the disclosure, an electronic device (e.g., the electronic device 101 in FIG. 1) may include a foldable display (e.g., the display 200 in FIG. 4), a decoration member (e.g., the decoration member 500 in FIG. 5) made of a resin material to surround at least a portion of the foldable display, a support member (e.g., the support member 400 in FIG. 5) configured to support the foldable display and including a metal area (e.g., the metal area 410 in FIG. 5) connected to the decoration member, and a conductive member (e.g., the conductive member 600 in FIG. 5) disposed on the decoration member and electrically connected to the metal area. The conductive member may include a first conductive member (e.g., the first conductive member 610 in FIG. 7A) arranged to face the support member and a second conductive member (e.g., the second conductive member 620 in FIG. 7A) arranged parallel to the first conductive member and electrically connected to the first conductive member.

According to various embodiments of the disclosure, the electronic device may further include an insulative member (e.g., the insulative member 700 in FIG. 5) disposed under the conductive member, and the insulative member may be spaced apart from the foldable display.

According to various embodiments of the disclosure, the support member may include a segment portion (e.g., the segment portion 450 in FIG. 8), and a resin area located in the segment portion (e.g., the resin area 440 in FIG. 5), the first conductive member may include a (1-1)th conductive member (e.g., the (1-1)th conductive member 612 in FIG. 9A) and a (1-2)th conductive member (e.g., the (1-2)th conductive member 614 in FIG. 9A), which are spaced apart from each other with reference to the segment portion, and the second conductive member may include a (2-1)th conductive member (e.g., the (2-1)th conductive member 622 in FIG. 9A) and a (2-2)th conductive member (e.g., the (2-2)th conductive member 624 in FIG. 9A), which are spaced apart from each other with reference to the segment portion.

According to various embodiments of the disclosure, the metal area may include a first metal area (e.g., the first metal area 420 in FIG. 5) defining a rim of the support member (e.g., the first rim 402, the second rim 404, or the third rim 406 in FIG. 8), and a second metal area configured to support the foldable display (e.g., the second metal area 430 in FIG. 5), and the support member may include a resin area (e.g., the resin area 440 in FIG. 5) located between the first metal area and the second metal area.

According to various embodiments of the disclosure, the support member may include a first protrusion (e.g., the first protrusion 422 in FIG. 5) extending from the first metal area and protruding toward the conductive member.

According to various embodiments of the disclosure, the support member may include a second protrusion (e.g., the second protrusion 432 in FIG. 6) extending from the second metal area and protruding toward the conductive member.

According to various embodiments of the disclosure, the electronic device may be configured to transmit electrical surge (e.g., the electrical surge 800 in FIG. 5) provided to the second conductive member from the outside of the electronic device to the metal area via the first conductive member.

According to various embodiments of the disclosure, the decoration member may include a first decoration member area (e.g., the first decoration member area 510 in FIG. 5) facing the support member, and a second decoration member area (e.g., the second decoration member area 520 in FIG. 5) facing a direction different from a direction the first decoration member area faces. The first conductive member may be disposed in the second decoration member area, and the second conductive member may be disposed in the first decoration member area.

According to various embodiments of the disclosure, the conductive member may include at least one of a conductive sheet, a conductive fabric, a conductive film, or a conductive paint.

According to various embodiments of the disclosure, the material of the first conductive member and the material of the second conductive member may be different from each other.

According to various embodiments of the disclosure, the decoration member may include a first decoration member area facing the support member, and a second decoration member area facing a direction different from a direction the first decoration member area faces, and the first conductive member and the second conductive member may be integral conductive members extending from the first decoration member area to the second decoration member area.

According to various embodiments of the disclosure, the support member may face the foldable display and may include an upper metal area (e.g., the upper metal area 480 in FIG. 10) including a through hole (e.g., the through hole 460 in FIG. 8) and a lower metal area (e.g., the lower metal area 490 in FIG. 10) located opposite to the upper metal area, and the second conductive member may include a (2-1)th conductive member (e.g., the (2-1)th conductive member 622 in FIG. 9B) and a (2-3)th conductive member (e.g., the (2-3)th conductive member 626 in FIG. 9B), which are spaced apart from each other with reference to the through hole.

According to various embodiments of the disclosure, the decoration member may include a fourth portion (e.g., the fourth portion S4 in FIG. 9B) facing the through hole, and the first conductive member may include a (1-1)th conductive member (e.g., the (1-1)th conductive member 612 in FIG. 9B) and a (1-3)th conductive member (e.g., the (1-3)th conductive member 616 in FIG. 9B), which are arranged along the (2-1)th conductive member, the fourth portion, and the (2-3)th conductive portion. The (1-1)th conductive member may be electrically connected to the (2-1)th conductive member, and the (1-3)th conductive member may be electrically connected to the (2-3)th conductive member.

According to various embodiments of the disclosure, the foldable display may include a display panel (e.g., the display panel 240 in FIG. 4) including a bent portion (e.g., the bent portion 242 in FIG. 4) and a bending protection layer (e.g., the bending protection layer 250 in FIG. 4) surrounding the bent portion, and the conductive member may face at least a portion of the bent portion.

According to various embodiments of the disclosure, the conductive member may be in contact with the metal area.

According to various embodiments of the disclosure, an electronic device (e.g., the electronic device 101 in FIG. 1) may include a foldable display (e.g., the display 200 in FIG. 4), a decoration member (e.g., the decoration member 500 in FIG. 5) made of a resin material to surround at least a portion of the foldable display, a support member (e.g., the support member 400 in FIG. 5) configured to support the foldable display and including a metal area (e.g., the metal area 410 in FIG. 5) connected to the decoration member, and a resin area (e.g., the resin area 450 in FIG. 5) disposed in the segment portion of the metal area, and a conductive member (e.g., the conductive member 600 in FIG. 5) electrically connected to the metal area. The decoration member may include a first decoration member area (e.g., the first decoration member area 510 in FIG. 5) facing the support member, and a second decoration member area (e.g., the second decoration member area 520 in FIG. 5) extending from the first decoration member area and facing a direction different from a direction the first decoration member area faces, the conductive member may be disposed in the first decoration member area and the second decoration member area, and the conductive member may include a third conductive member (e.g., the third conductive member 630 in FIG. 9C) and a fourth conductive member (e.g., the fourth conductive member 640 in FIG. 9C), which are spaced apart from each other with reference to the segment portion.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A portable communication device comprising:
   a housing comprising:
      a first housing; and
      a second housing, the housing configured to be foldable about a folding axis,
   wherein a side wall of the housing comprises:
      a first side wall portion extending parallel to the folding axis,
      a second side wall portion extending from a first end of the first side wall portion and perpendicular to the folding axis,
      a third side wall portion extending from a second end of the first side wall portion and perpendicular to the folding axis, and
      a fourth side wall portion extending between the second side wall portion and the third side wall portion and parallel to the folding axis, and
   wherein the housing further comprises:
      a conductive member defining the first side wall portion, the second side wall portion, the third side wall portion, and the fourth side wall portion;
      a protection member located along the conductive member defining the first side wall portion, the second side wall portion, the third side wall portion, and the fourth side wall portion;
      a conductive layer located on a portion of an inner surface of the protection member along the first side wall portion and electrically connected to the conductive member, wherein the conductive layer constitutes an electrical path that allows electrical stimulation applied from an outside of the portable communication device to be transmitted to the conductive member via the conductive layer;
      a flexible display accommodated in the first housing and the second housing in a state of being spaced apart from a portion of the conductive layer by a first distance, wherein the flexible display comprises a first portion on which a screen is displayed, a second portion located between the first portion and the housing and parallel to the first portion, and a bent portion extending between the first portion and the second portion and located adjacent to the conductive layer along the first side wall portion, and at least one wiring line electrically connected to a display driving circuit is located in the bent portion; and
      an insulative member located on the portion of the conductive layer to face the flexible display and spaced apart from the flexible display by a second distance less than the first distance.

2. The portable communication device of claim 1, wherein the insulative member is located such that foreign matter introduced from the outside of the portable communication device can be at least partially blocked by the insulative member.

3. The portable communication device of claim 1, wherein the conductive layer and the bent portion are not located in a portion of the flexible display that is close to the second side wall portion, the third side wall portion, and the fourth side wall portion.

4. The portable communication device of claim 1,
   wherein the protection member comprises:
      a first portion surrounding at least a portion of a side portion of the flexible display along the first side wall portion, and
      a second portion surrounding at least a portion of an upper portion of the flexible display, and wherein the conductive layer comprises:
a first conductive layer located on an inner surface of the first portion of the protection member, and
a second conductive layer located on an inner surface of the second portion of the protection member and electrically connected to the first conductive layer.

5. The portable communication device of claim 4,
wherein the first conductive layer is located to face a side portion of the bent portion, and
wherein the second conductive layer is located to face an upper portion of the bent portion.

6. The portable communication device of claim 4, wherein the first conductive layer and the second conductive layer are physically spaced apart from each other in a direction perpendicular to the folding axis.

7. The portable communication device of claim 6, wherein the first conductive layer is spaced apart from the second conductive layer by a distance that allows electrical stimulation transmitted to the first conductive layer to be at least partially transmitted to the second conductive layer.

8. The portable communication device of claim 4, wherein the second conductive layer extends along the first side wall portion in a longitudinal direction of the portable communication device.

9. The portable communication device of claim 4, further comprising:
a third conductive layer physically spaced apart from the first conductive layer in a direction parallel to the folding axis on the inner surface of the first portion,
wherein the third conductive layer is electrically connected to the conductive member and the second conductive layer.

10. The portable communication device of claim 4,
wherein the flexible display comprises a bending protection layer located on the bent portion, and
wherein at least a portion of the bending protection layer is located between the bent portion and the first conductive layer or between the bent portion and the second conductive layer.

11. The portable communication device of claim 1, wherein the first insulative member is spaced apart from the flexible display such that the first insulative member does not come into contact with the flexible display when the flexible display is bent.

12. The portable communication device of claim 11, wherein the first insulative member includes at least one of an elastic porous material or a buffer material.

13. A portable communication device comprising:
a flexible display configured to be capable of being at least partially bent about a bending axis;
a conductive frame defining a side wall of the portable communication device and configured to accommodate the flexible display;
a first insulative member disposed above the conductive frame to be spaced apart from the flexible display to surround the flexible display along the side wall; and
a conductive layer disposed above the first insulative member to be spaced apart from the flexible display,
wherein the conductive layer is located such that a margin of a first gap is provided between one end of the first insulative member and the conductive layer,
wherein the conductive layer is electrically connected to the conductive frame such that electrical stimulation applied from an outside of the portable communication device can be transmitted to the conductive frame via the conductive layer,
wherein a second insulative member is disposed above the conductive layer to be spaced apart from the flexible display, and
wherein the second insulative member is located such that a margin of a second gap is formed between the first insulative member and the second insulative member, and disposed to occupy at least a partial space between the first insulative member and the flexible display.

14. The portable communication device of claim 13,
wherein the flexible display comprises a bent portion comprising a wiring line electrically connected to a display driving circuit located between a rear surface of the flexible display and the conductive frame, and
wherein the conductive layer is disposed above a portion of the first insulative member corresponding to the bent portion to be spaced apart from the bent portion.

15. The portable communication device of claim 13, wherein the conductive frame comprises a portion exposed toward the conductive layer, and is electrically connected to the conductive layer via the exposed portion.

16. The portable communication device of claim 13,
wherein the conductive frame comprises:
a first conductive side wall portion defining a first portion of the side wall,
a second conductive side wall portion defining a second portion of the side wall, and
an insulative side wall portion located between the first conductive side wall portion and the second conductive side wall portion and defining a third portion between the first portion and the second portion of the side wall, and
wherein the first insulative member extends above the first conductive side wall portion, the second conductive side wall portion, and the insulative side wall portion.

17. An electronic device comprising:
a housing configured to be foldable about a folding axis;
a foldable display;
a transparent cover configured to cover the foldable display;
a support member configured to support the foldable display, the support member including a conductive side wall portion and a conductive support portion;
a protection member made of a resin material to surround an edge of the transparent cover in a spaced apart manner, the protection member attached to the support member;
a conductive member disposed on a portion of an inner surface of the protection member, the conductive member configured to provide an electrical path that allows a static electrical charge being applied from outside to be transmitted to the conductive support portion; and
an insulative member disposed on a portion of an inner surface of the conductive member, the insulative member configured to block a portion of a space between the transparent cover and the protection member.

18. The electronic device of claim 17,
wherein the housing includes a first housing and a second housing,
wherein the electronic device further includes a display driving integrated circuit disposed at the first housing, and
wherein the conductive member is disposed on one of lateral side edges of the first housing corresponding to the display driving integrated circuit.

19. The electronic device of claim 17,
wherein the support member comprises a segment portion and a resin area located on the segment portion, wherein the first conductive member comprises a (1-1)th conductive member and a (1-2)th conductive member spaced apart from each other with reference to the segment portion, and wherein the second conductive member comprises a (2-1)th conductive member and a (2-2)th conductive member spaced apart from each other with reference to the segment portion.

20. The electronic device of claim 19, wherein the conductive member may include a third conductive member and a fourth conductive member spaced apart from each other with reference to the segment portion.

21. The electronic device of claim 17, wherein the metal area comprises a first metal area forming a rim of the support member and a second metal area supporting the foldable display, and wherein the support member comprises a resin area located between the first metal area and the second metal area.

22. The electronic device of claim 17, wherein the first conductive member and the second conductive member are integral conductive members extending from the first decoration member area to the second decoration member area.

* * * * *